United States Patent
Heuft et al.

(10) Patent No.: US 8,529,997 B2
(45) Date of Patent: Sep. 10, 2013

(54) METHODS FOR PREPARING STRUCTURED ORGANIC FILM MICRO-FEATURES BY INKJET PRINTING

(75) Inventors: Matthew A. Heuft, Oakville (CA); Adrien P. Cote, Clarkson (CA)

(73) Assignee: Xerox Corporation, Norwalk, CT (US)

( * ) Notice: Subject to any disclaimer, the term of this patent is extended or adjusted under 35 U.S.C. 154(b) by 0 days.

(21) Appl. No.: 13/351,589

(22) Filed: Jan. 17, 2012

(65) Prior Publication Data

US 2013/0183447 A1  Jul. 18, 2013

(51) Int. Cl.
*B05D 1/40* (2006.01)
*B05D 3/00* (2006.01)

(52) U.S. Cl.
USPC ........... 427/331; 427/256; 427/384; 427/542; 427/557

(58) Field of Classification Search
None
See application file for complete search history.

(56) References Cited

U.S. PATENT DOCUMENTS

| | | | |
|---|---|---|---|
| 2,324,550 A | 7/1943 | Wolfe | |
| 3,430,418 A | 3/1969 | Wagner | |
| 3,801,315 A | 4/1974 | Gundlach et al. | |
| 4,078,927 A | 3/1978 | Amidon et al. | |
| 4,081,274 A | 3/1978 | Horgan | |
| 4,115,116 A | 9/1978 | Stolka et al. | |
| 4,233,384 A | 11/1980 | Turner et al. | |
| 4,257,699 A | 3/1981 | Lentz | |
| 4,265,990 A | 5/1981 | Stolka et al. | |
| 4,286,033 A | 8/1981 | Neyhart et al. | |
| 4,291,110 A | 9/1981 | Lee | |
| 4,299,897 A | 11/1981 | Stolka et al. | |
| 4,304,829 A | 12/1981 | Limburg et al. | |
| 4,306,008 A | 12/1981 | Pai et al. | |
| 4,338,387 A | 7/1982 | Hewitt | |
| 4,346,387 A * | 8/1982 | Hertz ............................. 347/75 |
| 4,387,980 A | 6/1983 | Ueno et al. | |
| 4,457,994 A | 7/1984 | Pai et al. | |
| 4,464,450 A | 8/1984 | Teuscher | |
| 4,489,593 A | 12/1984 | Pieters et al. | |
| 4,493,550 A | 1/1985 | Takekida | |
| 4,664,995 A | 5/1987 | Horgan et al. | |
| 4,855,203 A | 8/1989 | Badesha et al. | |

(Continued)

FOREIGN PATENT DOCUMENTS

| CA | 2 753 863 | 9/2010 |
|---|---|---|
| CA | 2 753 891 | 9/2010 |

(Continued)

OTHER PUBLICATIONS

Jun. 19, 2012 German Search Report issued in Application No. 10 2011 079 277.5 (with translation).

(Continued)

*Primary Examiner* — Timothy Meeks
*Assistant Examiner* — Michael P Rodriguez
(74) *Attorney, Agent, or Firm* — Oliff & Berridge, PLC

(57) ABSTRACT

Methods for making a substrate comprising structured organic film nano- to micro-features are disclosed. The methods for forming SOF micro-features may include: providing a substrate; discharging at least one droplet toward the substrate by an ink jet method, the at least one droplet including a plurality of molecular building blocks each comprising a segment and a number of functional groups; depositing the at least one droplet on the substrate; promoting a change in the deposited at least one droplet and forming at least one dry structured organic film (SOF) on the substrate.

20 Claims, 7 Drawing Sheets

(56) References Cited

U.S. PATENT DOCUMENTS

| | | | |
|---|---|---|---|
| 4,871,634 A | 10/1989 | Limburg et al. | |
| 4,917,711 A | 4/1990 | Xie et al. | |
| 4,921,769 A | 5/1990 | Yuh et al. | |
| 4,921,773 A | 5/1990 | Melnyk et al. | |
| 4,996,125 A | 2/1991 | Sakaguchi et al. | |
| 5,017,432 A | 5/1991 | Eddy et al. | |
| 5,061,965 A | 10/1991 | Ferguson et al. | |
| 5,110,693 A | 5/1992 | Friend et al. | |
| 5,139,910 A | 8/1992 | Law et al. | |
| 5,165,909 A | 11/1992 | Tennent et al. | |
| 5,166,031 A | 11/1992 | Badesha et al. | |
| 5,231,162 A | 7/1993 | Nagata | |
| 5,281,506 A | 1/1994 | Badesha et al. | |
| 5,300,271 A | 4/1994 | Golden et al. | |
| 5,366,772 A | 11/1994 | Badesha et al. | |
| 5,368,913 A | 11/1994 | Ortega | |
| 5,368,967 A | 11/1994 | Schank et al. | |
| 5,370,931 A | 12/1994 | Fratangelo et al. | |
| 5,432,539 A | 7/1995 | Anderson | |
| 5,455,136 A | 10/1995 | Yu et al. | |
| 5,456,897 A | 10/1995 | Moy et al. | |
| 5,500,200 A | 3/1996 | Mandeville et al. | |
| 5,569,635 A | 10/1996 | Moy et al. | |
| 5,658,702 A | 8/1997 | Nukada | |
| 5,702,854 A | 12/1997 | Schank et al. | |
| 5,707,916 A | 1/1998 | Snyder et al. | |
| 5,853,906 A | 12/1998 | Hsieh | |
| 5,877,110 A | 3/1999 | Snyder et al. | |
| 5,976,744 A | 11/1999 | Fuller et al. | |
| 6,002,907 A | 12/1999 | Berkes | |
| 6,020,426 A | 2/2000 | Yamaguchi et al. | |
| 6,107,117 A | 8/2000 | Bao et al. | |
| 6,107,439 A | 8/2000 | Yanus et al. | |
| 6,248,686 B1 | 6/2001 | Inagaki et al. | |
| 6,340,382 B1 | 1/2002 | Baksh et al. | |
| 6,464,756 B1 | 10/2002 | Plee | |
| 6,505,921 B2 | 1/2003 | Chwalek et al. | |
| 6,819,244 B2 | 11/2004 | Dukler et al. | |
| 7,067,687 B2 | 6/2006 | Pinnavaia et al. | |
| 7,177,572 B2 | 2/2007 | DiRubio et al. | |
| 7,196,210 B2 | 3/2007 | Yaghi et al. | |
| 7,202,002 B2 | 4/2007 | Tokarski et al. | |
| 7,384,717 B2 | 6/2008 | Dinh et al. | |
| 7,416,824 B2 | 8/2008 | Kondoh et al. | |
| 7,560,205 B2 | 7/2009 | Qi et al. | |
| 7,582,798 B2 | 9/2009 | Yaghi et al. | |
| 7,799,495 B2 | 9/2010 | Wu et al. | |
| 8,065,904 B1 | 11/2011 | Allendorf et al. | |
| 8,093,347 B2 * | 1/2012 | Heuft et al. | 528/211 |
| 8,119,314 B1 | 2/2012 | Heuft et al. | |
| 8,119,315 B1 | 2/2012 | Heuft et al. | |
| 8,313,560 B1 | 11/2012 | Cote et al. | |
| 8,334,360 B2 * | 12/2012 | Heuft et al. | 528/230 |
| 2002/0098346 A1 | 7/2002 | Yitzchaik | |
| 2003/0054948 A1 | 3/2003 | Pinnavaia et al. | |
| 2003/0099845 A1 | 5/2003 | Ogawa et al. | |
| 2003/0126989 A1 | 7/2003 | Bancon et al. | |
| 2003/0172808 A1 | 9/2003 | Le Bec | |
| 2004/0147664 A1 | 7/2004 | Lee et al. | |
| 2004/0171482 A1 | 9/2004 | Pinnavaia et al. | |
| 2004/0244865 A1 | 12/2004 | Jung et al. | |
| 2005/0017633 A1 | 1/2005 | Miyadera | |
| 2005/0257685 A1 | 11/2005 | Baksh et al. | |
| 2005/0260443 A1 | 11/2005 | Marks et al. | |
| 2006/0046169 A1 | 3/2006 | Shoshi | |
| 2006/0097393 A1 | 5/2006 | Uchimaru et al. | |
| 2006/0154807 A1 | 7/2006 | Yaghi et al. | |
| 2006/0182993 A1 | 8/2006 | Ogata et al. | |
| 2006/0204742 A1 | 9/2006 | Gronbeck et al. | |
| 2006/0236862 A1 | 10/2006 | Golden et al. | |
| 2007/0123606 A1 | 5/2007 | Toma et al. | |
| 2007/0287220 A1 | 12/2007 | Jeong et al. | |
| 2008/0107980 A1 | 5/2008 | De Jong et al. | |
| 2008/0132669 A1 | 6/2008 | Eriguchi et al. | |
| 2008/0233343 A1 | 9/2008 | Cheng et al. | |
| 2008/0268135 A1 | 10/2008 | Yokoyama et al. | |
| 2008/0316247 A1 | 12/2008 | Cellura et al. | |
| 2009/0025555 A1 | 1/2009 | Lively et al. | |
| 2009/0046125 A1 | 2/2009 | Nystrom et al. | |
| 2009/0053417 A1 | 2/2009 | Mino | |
| 2009/0117476 A1 | 5/2009 | Heuft et al. | |
| 2009/0149565 A1 | 6/2009 | Liu et al. | |
| 2009/0208857 A1 | 8/2009 | Wu et al. | |
| 2010/0015540 A1 | 1/2010 | Dinh et al. | |
| 2010/0068635 A1 | 3/2010 | Tanaka | |
| 2010/0143693 A1 | 6/2010 | Yaghi et al. | |
| 2010/0224867 A1 | 9/2010 | Heuft et al. | |
| 2010/0227071 A1 | 9/2010 | Heuft et al. | |
| 2010/0227998 A1 * | 9/2010 | Heuft et al. | 528/211 |
| 2010/0228025 A1 | 9/2010 | Cote et al. | |
| 2010/0240781 A1 | 9/2010 | Cooper et al. | |
| 2011/0011128 A1 | 1/2011 | Grover | |
| 2011/0030555 A1 | 2/2011 | Jonschker et al. | |
| 2011/0076605 A1 | 3/2011 | Doi et al. | |
| 2011/0236301 A1 | 9/2011 | Kang et al. | |
| 2012/0029236 A1 | 2/2012 | Cote et al. | |
| 2012/0031268 A1 | 2/2012 | Yaghi et al. | |
| 2012/0040282 A1 | 2/2012 | Heuft et al. | |
| 2012/0040283 A1 | 2/2012 | Heuft et al. | |
| 2012/0152117 A1 | 6/2012 | Lively et al. | |

FOREIGN PATENT DOCUMENTS

| | | |
|---|---|---|
| CA | 2 753 940 | 9/2010 |
| CA | 2 753 945 | 9/2010 |
| DE | 10 2008 011 840 A1 | 9/2009 |
| EP | 0312376 A2 | 4/1989 |
| JP | 9 087849 A | 3/1997 |
| KR | 10-0832309 B1 | 5/2008 |
| WO | WO 91/15813 | 10/1991 |
| WO | WO 2006/064892 A1 | 6/2006 |
| WO | WO 2007/090864 A1 | 8/2007 |
| WO | WO 2007/098263 A2 | 8/2007 |
| WO | WO 2008/091976 A1 | 7/2008 |
| WO | WO 2009/022187 A1 | 2/2009 |
| WO | WO 2009/127896 A1 | 10/2009 |
| WO | WO 2010/102018 A1 | 9/2010 |
| WO | WO 2010/102025 A1 | 9/2010 |
| WO | WO 2010/102027 A1 | 9/2010 |
| WO | WO 2010/102036 A1 | 9/2010 |
| WO | WO 2010/102038 A1 | 9/2010 |
| WO | WO 2010/102043 A1 | 9/2010 |

OTHER PUBLICATIONS

Aug. 10, 2012 Notice of Allowance issued in U.S. Appl. No. 13/181,912.
Aug. 10, 2012 Office Action issued in U.S. Appl. No. 12/716,449.
Aug. 3, 2012 Office Action issued in U.S. Appl. No. 12/716,686.
Jul. 6, 2012 Office Action issued in U.S. Appl. No. 12/716,706.
Aug. 3, 2012 Office Action issued in U.S. Appl. No. 12/815,688.
Jun. 25, 2012 Office Action issued in U.S. Appl. No. 12/845,052.
Aug. 8, 2012 Office Action issued in U.S. Appl. No. 13/181,761.
U.S. Appl. No. 13/572,095, filed Aug. 10, 2012, Sara J. Vella et al.
Aug. 3, 2012 Notice of Allowance issued in U.S. Appl. No. 12/845,053.
Aug. 8, 2012 Extended European Search Report issued in European Patent Application No. 10749278.7.
Aug. 10, 2012 European Search Report issued in European Patent Application No. 10749283.7.
Aug. 6, 2012 European Search Report issued in European Patent Application No. 10749285.2.
Aug. 6, 2012 European Search Report issued European Patent Application No. 10749276.1.
Aug. 6, 2012 European Search Report issued in European Patent Application No. 10749274.6.
Aug. 10, 2012 European Search Report issued in European Patent Application No. 10749289.4.
Aug. 15, 2012 Notice of Allowance issued in for U.S. Appl. No. 13/315,452.
Sep. 6, 2012 Office Action issued in U.S. Appl. No. 13/182,047.
Sep. 6, 2012 Office Action issued in U.S. Appl. No. 12/716,324.
U.S. Appl. No. 13/571,933, filed Aug. 10, 2012, Sarah J. Vella et al.

Oct. 31, 2012 Search Report issued in GB1217201.1.
Jan. 3, 2013 Notice of Allowance issued in U.S. Appl. No. 13/182,047.
Shun Wan et al., "A Belt-Shaped, Blue Luminescent, and Semiconducting Covalent Organic Framework," Angew. Chem. Int. Ed., vol. 47, pp. 8826-8830 (published on web Jan. 10, 2008).
Nikolas A. A. Zwaneveld et al., "Organized Formation of 2D Extended Covalent Organic Frameworks at Surfaces," *J. Am. Chem. Soc.*, vol. 130, pp. 6678-6679 (published on web Apr. 30, 2008).
Adrien P. Cote et al., "Porous, Crystalline, Covalent Organic Frameworks," *Science*, vol. 310, pp. 1166-1170 (Nov. 18, 2005).
Hani El-Kaderi et al., "Designed Synthesis of 3D Covalent Organic Frameworks," *Science*, vol. 316, pp. 268-272 (Apr. 13, 2007).
Adrien P. Cote et al., "Reticular Synthesis of Microporous and Mesoporous Covalent Organic Frameworks" *J. Am. Chem. Soc.*, vol. 129, 12914-12915 (published on web Oct. 6, 2007).
Omar M. Yaghi et al., "Reticular synthesis and the design of new materials," *Nature*, vol. 423, pp. 705-714 (Jun. 12, 2003).
Nathan W. Ockwig et al., "Reticular Chemistry: Occurrence and Taxonomy of Nets and Grammar for the Design of Frameworks," *Acc. Chem. Res.*, vol. 38, No. 3, pp. 176-182 (published on web Jan. 19, 2005).
Pierre Kuhn et al., Porous, Covalent Triazine-Based Frameworks Prepared by Ionothermal Synthesis, *Angew. Chem. Int. Ed.*, vol. 47, pp. 3450-3453. (Published on web Mar. 10, 2008).
Jia-Xing Jiang et al., "Conjugated Microporous Poly(aryleneethylnylene) Networks," *Angew. Chem. Int. Ed.*, vol. 46, (2008) pp. 1-5 (Published on web Sep. 26, 2008).
Hunt, J.R. et al. "Reticular Synthesis of Covalent-Organic Borosilicate Frameworks" *J. Am. Chem. Soc.*, vol. 130, (2008), 11872-11873. (published on web Aug. 16, 2008).
Apr. 28, 2010 International Search Report issued in PCT/US 10/26082.
Apr. 28, 2010 Written Opinion issued in PCT/US 10/26082.
Apr. 27, 2010 International Search Report issued in PCT/US 10/26071.
Apr. 27, 2010 Written Opinion issued in PCT/US 10/26071.
Apr. 28, 2010 International Search Report issued in PCT/US 10/26091.
Apr. 28, 2010 Written Opinion issued in PCT/US 10/26091.
Apr. 28, 2010 International Search Report issued in PCT/US 10/26100.
Apr. 28, 2010 Written Opinion issued in PCT/US 10/26100.
Apr. 16, 2010 International Search Report issued in PCT/US 10/26079.
Apr. 16, 2010 Written Opinion issued in PCT/US 10/26079.
Apr. 20, 2010 International Search Report issued in PCT/US 10/26094.
Apr. 20, 2010 Written Opinion issued in PCT/US 10/26094.
U.S. Appl. No. 12/716,571, filed Mar. 3, 2010, Matthew A. Heuft et al.
U.S. Appl. No. 12/716,524, filed Mar. 3, 2010, Matthew A. Heuft et al.
U.S. Appl. No. 12/716,324, filed Mar. 3, 2010, Matthew A. Heuft et al.
U.S. Appl. No. 12/716,686, filed Mar. 3, 2010, Matthew A. Heuft et al.
U.S. Appl. No. 12/716,449, filed Mar. 3, 2010, Adrien Pierre Cote et al.
Cassie, A.B.D. et al., "Wettability of Porous Surfaces," Trans. Faraday Soc., vol. 40, pp. 546-551, Jun. 1944.
U.S. Appl. No. 12/854,962, filed Aug. 12, 2010, Matthew A. Heuft et al.
U.S. Appl. No. 12/815,688, filed Jun. 15, 2010, Adrien P. Cote at al.
U.S. Appl. No. 12/854,957, filed Aug. 12, 2010, Matthew A. Heuft et al.
U.S. Appl. No. 12/845,053, filed Jul. 28, 2010, Adrien P. Cote et al.
U.S. Appl. No. 12/845,235, filed Jul. 28, 2010, Adrien P. Cote at al.
U.S. Appl. No. 12/566,568, filed Sep. 24, 2009, Eugene M. Chow et al.
U.S. Appl. No. 12/566,518, filed Sep. 24, 2009, Eugene M. Chow et al.
U.S. Appl. No. 12/716,706, filed Mar. 3, 2010, Adrien Pierre Cote et al.
U.S. Appl. No. 12/845,052, filed Jul. 28, 2010, Adrien Pierre Cote et al.
Colson at al. "Oriented 2D Covalent Organic Framework Thin Films on Single-Layer Graphene", *Science*, 332, 228-231 (2011).
K.S. Novoselov et al., "Electric Field Effect in Atomically Thin Carbon Films", *Science*, Oct. 22, 2004, pp. 666-669, vol. 306.
Stankovich et al., "Graphene-Based Composite Materials", *Nature*, Jul. 20, 2006, pp. 282-286, vol. 442.
U.S. Appl. No. 13/173,948, filed Jun. 30, 2011, Adrien Pierre Cote et al.
U.S. Appl. No. 13/042,950, filed Mar. 8, 2011, Adrien Pierre Cote et al.
U.S. Appl. No. 13/181,761, filed Jul. 13, 2011, Adrien Pierre Cote et al.
U.S. Appl. No. 13/181,912, filed Jul. 13, 2011, Adrien Pierre Cote et al.
U.S. Appl. No. 13/174,046, filed Jun. 30, 2011, Matthew A. Heuft et al.
Jun. 1, 2011 Office Action issued in U.S. Appl. No. 12/716,524.
U.S. Appl. No. 13/351,561, filed Jan. 17, 2012, Matthew A. Heuft et al.
U.S. Appl. No. 13/246,109, filed Sep. 27, 2011, Matthew A. Heuft et al.
U.S. Appl. No. 13/246,227, filed Sep. 27, 2011, Adrien Pierre Cote et al,.
U.S. Appl. No. 13/246,268, filed Sep. 27, 2011, Matthew A. Heuft et al.
Nov. 14, 2011 Notice of Allowance issued in U.S. Appl. No. 12/854,957.
Nov. 14, 2011 Notice of Allowance issued in U.S. Appl. No. 12/854,962.
Sep. 26, 2011 Office Action issued in U.S. Appl. No. 12/854,962.
Sep. 27, 2011 Office Action issued in U.S. Appl. No. 12/854,957.
Nov. 21, 2011 Office Action issued in U.S. Appl. No. 12/815,688.
Feb. 7, 2012 Office Action issued in U.S. Appl. No. 13/173,948.
Sep. 19, 2011 Notice of Allowance issued in U.S. Appl. No. 12/716,524.
Mar. 29, 2012 Office Action issued in U.S. Appl. No. 12/845,235.
Apr. 6, 2012 Office Action issued in U.S. Appl. No. 13/315,452.
Peter M. Budd; Putting Order into Polymer Networks; Science, 2007, 316, 210-211.
Wan, S., Guo, J., Kim, J., Ihee, H. and Jiang, D.; A Photoconductive Covalent Organic Framework: Self-Condensed Amite Cubes Composed of Eclipsed 2D Polypyrene Sheets for Photocurrent Generation; Angewandte Chemie International Edition, 2009, 48, 5439-5442.
Porous, Crystalline, Covalent Organic Framework, Cote, Nov. 18, 2005 vol. 310 Science http://www.sciencemag.org/content/310/5751/1166.full?sid=6bbe3427-6590-4387-afd9-5e4156547de4.
Mar. 14, 2013 Office Action issued in U.S. Appl. No. 12/845,052.
U.S. Appl. No. 13/804,874, filed Mar. 14, 2013 to Wigglesworth et al.
U.S. Appl. No. 13/748,114, filed Jan. 23, 2013 to Heuft et al.
Jan. 16, 2013 Notice of Allowance issued in U.S. Appl. No. 12/716,449.
U.S. Appl. No. 13/746,686, filed Jan. 22, 2013 to Cote et al.
Feb. 15, 2013 Office Action issued in U.S. Appl. No. 12/815,688.
Mar. 13, 2013 Office Action issued in U.S. Appl. No. 12/716,571.
Mar. 12, 2013 Notice of Allowance issued in U.S. Appl. No. 13/246,268.
Mar. 22, 2013 Office Action issued in U.S. Appl. No. 13/246,109.
Apr. 5, 2013 Canadian Office Action issued in Canadian Patent Application No. 2,769,976.
R.J. Jeng et al. "Low Loss Second-Order Nonlinear Optical Polymers Based on All Organic Sol-Gel Materials," Journal of Applied Polymer Science, Jan. 10, 1995, pp. 209-214, vol. 55, No. 2, John Wiley & Sons, Inc.
Apr. 9, 2013 European Office Action issued in European Patent Application No. 10 749 274.

Apr. 9, 2013 European Office Action issued in European Patent Application No. 10 749 276.
Apr. 9, 2013 European Office Action issued in European Patent Application No. 10 749 285.
Apr. 9, 2013 European Office Action issued in European Patent Application No. 10 749 283.
Apr. 9, 2013 European Office Action issued in European Patent Application No. 10 749 278.
Mar. 29, 2013 Chinese Office Action issued in Chinese Patent Application No. 201080019368.2 (with translation).

* cited by examiner

IDEAL ROD BUILDING BLOCK

IDEAL ROD BUILDING BLOCK

DISTORTED ROD BUILDING BLOCK

DISTORTED ROD BUILDING BLOCK

IDEAL TRIANGULAR BUILDING BLOCK

IDEAL TRIANGULAR BUILDING BLOCK

DISTORTED TRIANGULAR BUILDING BLOCK

DISTORTED TRIANGULAR BUILDING BLOCK

IDEAL TETRAHEDRAL BUILDING BLOCK

IDEAL TETRAHEDRAL BUILDING BLOCK

DISTORTED TETRAHEDRAL BUILDING BLOCK

DISTORTED TETRAHEDRAL BUILDING BLOCK

IDEAL SQUARE BUILDING BLOCK

DISTORTED SQUARE/TETRAHEDRAL BUILDING BLOCK

DISTORTED SQUARE/TETRAHEDRAL BUILDING BLOCK

US 8,529,997 B2

METHODS FOR PREPARING STRUCTURED ORGANIC FILM MICRO-FEATURES BY INKJET PRINTING

CROSS-REFERENCE TO RELATED APPLICATIONS

This nonprovisional application is related to U.S. patent application Ser. No. 13/351,561 concurrently filed herewith, and U.S. patent application Ser. Nos. 12/716,524; 12/716,449; 12/716,706; 12/716,324; 12/716,686; 12/716,571; 12/815,688; 12/845,053; 12/845,235; 12/854,962; 12/854,957; 12/845,052, 13/042,950, 13/173,948, 13/181,761, 13/181,912, 13/174,046, and 13/182,047; and U.S. Provisional Application No. 61/157,411, the disclosures of which are totally incorporated herein by reference in their entireties.

BACKGROUND

A Structured organic film (SOF) is a covalent organic framework (COF) that is a film at a macroscopic level. SOFs are fundamentally different than COFs because the SOF can be for instance orders of magnitude larger in coverage than a microscopic level COF network. SOFs may be coated by a variety of solvent-based processing methods to prepare supported and free-standing films. The methods disclosed in the above applications are suitable for preparing SOFs with larger general features.

The methods of the present disclosure allow for precisely placing SOF(s) micro-features. The methods of the present disclosure may be employed to produce SOFs in predetermined in spatial configurations such that the SOF maintains desirable physical and chemical properties of SOFs with larger general features and may also include a further functionality through a specific spatial configuration of surface SOF micro-features, which may be regularly spaced. Such SOF micro-features and surface patterned SOFs with a further functionality may be prepared by the methods of the present disclosure including for example an inkjet method.

For example, the methods of the present disclosure may be employed to produce SOF micro-features that may be attached and/or bonded (such as by covalent bonds) into structures with specific, tunable properties. Such SOF micro-features may be deposited by ink jet methods on a substrate in spatial arrangements or patterns that can provide a further functionality to the substrate.

SUMMARY OF THE DISCLOSURE

There is provided in embodiments methods for forming a structured organic film (SOF) micro-feature, the method comprising providing a substrate; discharging at least one droplet toward the substrate by an inkjet method and depositing the at least one droplet on a surface of the substrate, the at least one droplet comprising a reaction mixture comprising a plurality of molecular building blocks; and promoting a change in one or more of the at least one deposited droplets to form at least one SOF micro-feature, the SOF micro-feature comprising a plurality of segments including at least a first segment type and a plurality of linkers including at least a first linker type arranged as a covalent organic framework (COF) on the surface of the substrate.

There is also provided in embodiments methods for forming a structured organic film (SOF) micro-feature, the method comprising: providing a substrate; discharging a first one or more droplets toward the substrate by an ink jet method and depositing at least one of the first one or more droplets on a surface of the substrate at a first predetermined location, the first one or more droplets including a first reaction mixture comprising a first plurality of molecular building blocks; promoting a change in at least one of the deposited droplets to form at least one SOF micro-feature, the at least one SOF micro-feature comprising a plurality of segments including at least a first segment type and a plurality of linkers including at least a first linker type arranged as a covalent organic framework (COF) on the surface of the substrate.

BRIEF DESCRIPTION OF THE DRAWINGS

Other aspects of the present disclosure will become apparent as the following description proceeds and upon reference to the following figures which represent illustrative embodiments.

Unless otherwise noted, the same reference numeral in different Figures refers to the same or similar feature.

DETAILED DESCRIPTION

Figure 1A:
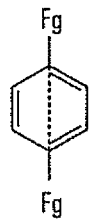
FIG. 1A-O are illustrations of exemplary building blocks whose symmetrical elements are outlined.
Figure 1B:
Figure 1C:
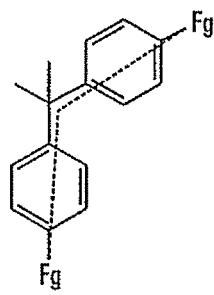
Figure 1D:
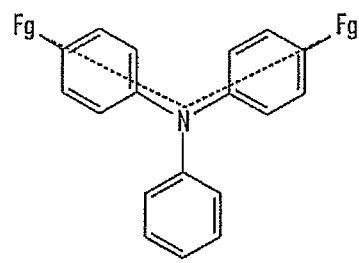
Figure 1E:
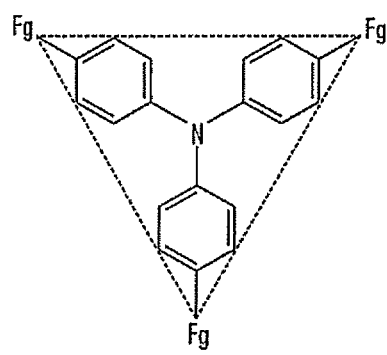
Figure 1F:
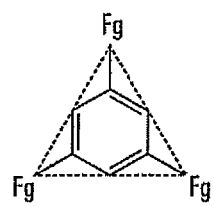
Figure 1G:
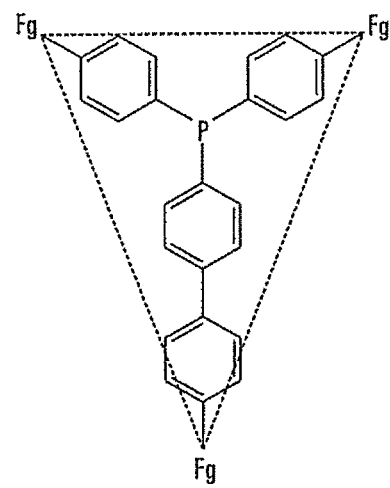
Figure 1H:
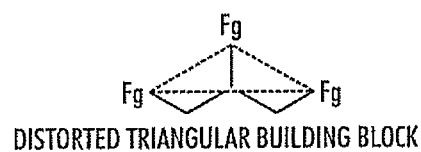
Figure 1I:
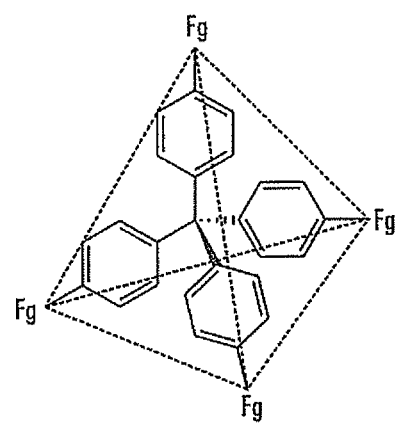
Figure 1J:
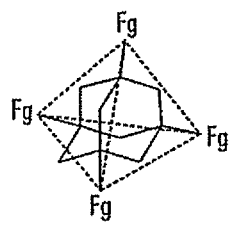
Figure 1K:
Figure 1L:
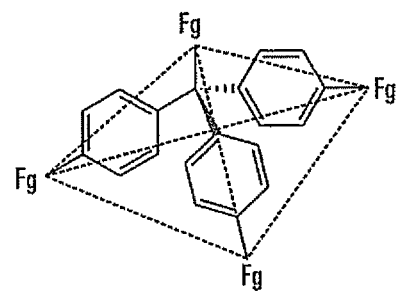
Figure 1M:
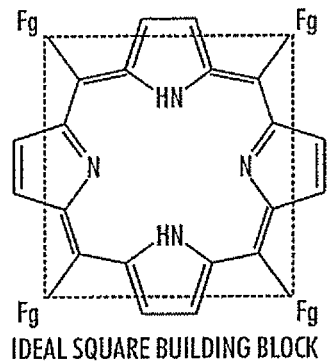
Figure 1N:
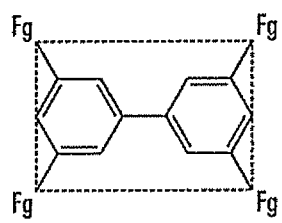

"Structured organic film" (SOF) refers to a COF that is a film at a macroscopic level. The imaging members of the present disclosure may comprise SOFs, such as composite SOFs, which optionally may have a capping unit or group added into the SOF.

The term "photoreceptor" or "photoconductor" as used herein, may be interchangeably with the term "imaging member." The term "electrophotographic" includes "electrostatographic" and "xerographic."

In this specification and the claims that follow, singular forms such as "a," "an," and "the" include plural forms unless the content clearly dictates otherwise.

The term "SOF" or "SOF composition" generally refers to a covalent organic framework (COF) that is a film at a macroscopic level. However, as used in the present disclosure the term "SOF" does not encompass graphite, graphene, and/or diamond. The phrase "macroscopic level" refers, for example, to the view of the present SOFs by optical microscopy. Although COFs are a network at the "microscopic level" or "molecular level" (requiring use of powerful magnifying equipment or as assessed using scattering methods), SOFs are fundamentally different at the "macroscopic level" because the film is for instance orders of magnitude larger in coverage than a microscopic level COF network. SOFs described herein that may be used in the embodiments described herein are solvent resistant and have macroscopic morphologies much different than typical COFs previously synthesized.

The SOFs of the present disclosure may be, at the macroscopic level, substantially pinhole-free SOFs or pinhole-free SOFs having continuous covalent organic frameworks that extend over larger length scales. It will also be appreciated that SOFs tend to have large aspect ratios where typically two dimensions of a SOF will be much larger than the third. SOFs have markedly fewer macroscopic edges and disconnected external surfaces than a collection of COF particles.

In embodiments, a "substantially pinhole-free SOF" or "pinhole-free SOF" may be formed from a reaction mixture deposited on the surface of an underlying substrate. The term "substantially pinhole-free SOF" refers, for example, to an SOF that may or may not be removed from the underlying substrate on which it was formed and contains substantially no pinholes, pores or gaps greater than the distance between the cores of two adjacent segments per square cm; such as, for example, less than 10 pinholes, pores or gaps greater than about 250 nanometers in diameter per $cm^2$, or less than 5 pinholes, pores or gaps greater than about 100 nanometers in diameter per $cm^2$. The term "pinhole-free SOF" refers, for example, to an SOF that may or may not be removed from the underlying substrate on which it was formed and contains no pinholes, pores or gaps greater than the distance between the cores of two adjacent segments per $micron^2$, such as no pinholes, pores or gaps greater than about 500 Angstroms in diameter per $micron^2$, or no pinholes, pores or gaps greater than about 250 Angstroms in diameter per $micron^2$, or no pinholes, pores or gaps greater than about 100 Angstroms in diameter per $micron^2$.

In embodiments, the SOF comprises at least one atom of an element that is not carbon, such as least one atom selected from the group consisting of hydrogen, oxygen, nitrogen, silicon, phosphorous, selenium, fluorine, boron, and sulfur. For example, an exemplary SOF (comprising one or more segments types and at least one or more linker types) may comprise at least one atom of an element that is not carbon, such as where the structure of the framework of the SOF comprises at least one atom selected from the group consisting of hydrogen, oxygen, nitrogen, silicon, phosphorous, selenium, fluorine, boron, and sulfur. In further embodiments, the SOF is a boroxine-, borazine-, borosilicate-, and boronate ester-free SOF.

The methods of the present disclosure may be employed to produce SOF by an inkjet method. In embodiments, the methods of the present disclosure may be employed to produce SOF micro-features or SOFs with micro features. The term "SOF micro-feature" or "micro-feature" refers, for example, to a SOF nano- to micron-scale structure that may or may not be visible at a macroscopic level, such as a SOF nano- to micron-scale surface structure that may or may not be visible at a macroscopic level that is present only on a portion of the surface on which it was formed. The SOF micro-features described herein may be different than other SOFs and COFs because micro-features result in an improved capability in terms of tunable conformations and/or arrangements.

When used to describe one or more micro-features, the term "conformation" refers, for example, to a particular two or three-dimensional shape of a single micro-feature. Conformations can include both abstract or geometric shapes (e.g. dots, lines, crosshatch, prisms, conics, rectangles, waves and the like), or other conformations selected so that the shape of the micro-feature, the arrangement of one or more micro-features, and/or the properties of the SOF comprising the one or more micro-features forms any electronic element normally found in an electronic device or circuit (e.g. resistor, transistor, conductor, diode, op-amp, semiconductor, oscillator and the like) or forms a elements of a microfluidic device (e.g. channel, separating column, mixing chamber, valve, reaction chamber, and the like).

When used to describe one or more micro-features, the term "arrangement" or "arranged" refers, for example, the relative or absolute spatial positioning of one or more micro-features. Micro-features may be arranged in any desired manner. For example, the methods of the present disclosure may be employed to produce micro-features that may be arranged in a repeating, irregular, geometric or abstract pattern of micro-features. In addition, the methods of the present disclosure may be employed to produce micro-features can be arranged such that individual micro-features, interconnected micro-features, multi-layered micro-features or micro-features and a substrate define an electronic device or an electronic circuit. In other arrangements, individual micro-features, interconnected micro-features, layered micro-features or micro-features and a substrate may define elements of a microfluidic device.

In embodiments, the methods of the present disclosure may be used to impart unique surface morphology on a substrate, such as, for example, a photoreceptor. For example, using a photoreceptor (or an overcoated photoreceptor) with a rough surface created by employing a mechanical polishing procedure provides a surface that helps smooth interaction between the cleaning blade and the photoreceptor, thus minimizing blade damage and non-uniform photoreceptor wear. As the printing continues, the photoreceptor will generate its natural rough surface, and consequently maintains good interaction with the cleaning blade even after the initial surface structure is worn away. As for belt photoreceptor application, it has also been demonstrated previously that a polished photoreceptor belt exhibited low ghosting level. However, creating the desired surface through mechanical polish requires a repetitive process that takes additional time, is costly, and lacks of control of the surface morphology.

In embodiments, the methods of the present disclosure may be used to provide a photoreceptor that includes an outer layer having an SOF, such as, for example, a photoreceptor having at least one SOF nano- to micron-scale surface-structure that is formed by employing an ink jet method. In embodiments, such an outer layer may be an overcoat or a charge transport layer. The use of an ink jet method to manufacture SOF nano- to micron-scale surface-structures allows for the production of a uniform roughened surface to the outer layer, that is, roughened such that the surface is marked by predetermined irregularities, protuberances, or ridges, and is not smooth. In addition, in view of the precision of conventional ink jet methods, the roughness is homogenous in degree, or regular and even throughout the surface of the outer layer. The patterned imaging member surfaces of the present disclosure offer lower friction with the cleaning blade, and thus improved print quality and smoother interaction to minimize blade damage. The patterned imaging member surfaces of the present disclosure also reduce paper edge ghosting (charge stress cycling) of imaging members, such as xerographic photoreceptors. The patterned imaging member surfaces of the present disclosure offer lower differential aging when subjected to positive charge stress cycling. Thus, it is expected that the controlled photoreceptor morphology helps extend customer replacement units life.

In embodiments, the structured surfaces formed by the methods of the present disclosure, which may include an ink jet method, can give homogenously periodic and wide patterns on the outer layer surface. Depending on the desired arrangement of the SOF nano- to micron-scale surface-structures, the morphology of the surface may be controlled.

In embodiments, the present disclosure also provides methods for forming SOF microstructures that comprises providing a substrate; discharging at least one droplet toward the substrate by an ink jet method, the at least one droplet including a plurality of molecular building blocks each comprising a segment and a number of functional groups; optionally depositing the at least one droplet at a predetermined position on the substrate; promoting a change in the deposited at least one droplet and forming at least one dry structured organic film (SOF) on the substrate at the location of the deposited at least one droplet.

The manufacturing methods of the present disclosure employ an inkjet apparatus is capable of discharging or ejecting a droplet comprising a liquid SOF reaction mixture toward a substrate. Suitable inkjet technologies may include, for example, thermal (bubble jet), piezoelectric, and continuous. In each, tiny droplets of liquid SOF reaction mixture are discharged (i.e., sprayed) onto a substrate. In a thermal jet printer, a heat source vaporizes components of the liquid SOF reaction mixture to create a bubble. The expanding bubble causes a droplet to form, and the droplet is discharged from the print head. Piezoelectric inkjet methods use a piezo crystal located at the back of a reservoir. Alternating electric potentials are used to cause vibrations in the crystal. The back and forth motion of the crystal is able to draw in enough of the liquid SOF reaction mixture for one droplet and discharge that droplet onto the substrate. In continuous inkjet methods, one or more nozzles continuously fire and an electrode associated with each nozzle may deflect the liquid SOF reaction mixture droplets to a gutter for collection or towards the substrate.

For example, in embodiments where the SOFs of the present disclosure are prepared via a continuous ink jet method, a pressurized stream of liquid SOF reaction mixture may be discharged from one or more nozzles and broken up into droplets, which are either directed toward the substrate, or are directed toward a gutter for recirculation. Controllable drop breakoff may be provided by various known methods, for example as described in U.S. Pat. No. 6,505,921 (pulsing heaters at intervals that control the drop size). Drops of liquid SOF reaction mixture having different sizes are then directed either toward the substrate or toward the gutter. In embodiments, drops may be directed by an air stream, by asymmetric pulsing of heaters on different sides of the nozzle, or by utilizing electrostatic charging devices that are placed close to the point where a filament of the liquid SOF reaction mixture breaks into individual ink droplets, i.e., the droplets are electrically charged and then directed to an appropriate (or predetermined) location by deflection electrodes having a large potential difference.

In embodiments, the fabrication steps for the SOF, such as an SOF having nano- to micron-scale surface-structures, may include ink-jet printing (by any conventional inkjet apparatus) a liquid SOF reaction mixture. In embodiments, the methods of the present disclosure may comprise arranging the droplets on the surface of the substrate to form a nano- or micron-scale pattern of droplets on the substrate. Thereafter, a change is promoted in the SOF reaction mixture that was jetted onto the surface of the substrate, resulting in the formation of a dry SOF, such as, for example, an outer layer having a SOF surface-structure pattern on a nano- or micron-scale. After the droplet comprising a liquid SOF reaction mixture is deposited on the substrate, the steps for forming a dry SOF may be carried out as explained in detail below.

In embodiments, droplets comprising a liquid SOF reaction mixture may be deposited on the substrate before a change is promoted in the SOF reaction mixture to form the dry SOF, such as a dry SOF with nano- to micron-scale surface-structures. In embodiments, a desired nano- to micron-scale pattern may be formed in a series of steps where only a fraction of the total number of droplets needed to complete the desired surface morphology are deposited on the surface of the substrate before a change is promoted in the SOF reaction mixture to form the dry SOF nano- to micron-scale surface-structures, and this process may be repeated until a complete desired morphology of the surface is obtained.

In embodiments, the surface pattern of SOF nano- to micron-scale surface-structures may include specific shapes and dimensions. For example, SOF nano- to micron-scale surface-structures may be in the form of one or more ridges, lines, circles, rods, squares, triangles, polygons, mixtures thereof and the like. The dimensions of such structures may be from a few nanometers to thousands of microns. In embodiments, the surface pattern of SOF nano- to micron-scale surface-structures may include an array of such SOF protrusions or bumps (such as in a form resembling any of the aforementioned shapes or combinations thereof) having a height of from about 50 nanometers to about 15 microns, or from about 500 nanometers to about 10 microns, or from about 800 nanometers to about 5 microns, or from about 1 micron to about 2 microns.

In further embodiments, each of the protrusions or bumps has a perimeter from about 50 nanometers to about 100 microns, such as from about 250 nanometers to about 50 microns, or from about 500 nanometers to about 25 microns. The protrusions may be in the shape of ridges, lines, circles, rods, squares, triangles, polygons, mixtures thereof and the like. The array of protrusions may be regularly positioned over the surface of the outer layer.

In embodiments, the surface pattern of SOF nano- to micron-scale surface-structures may be such that an array of protrusions or bumps are formed in which the individual SOF nano- to micron-scale surface-structures are uniformly positioned across the surface of the outer layer. The SOF nano- to micron-scale surface-structures (protrusions) may include specific dimensions.

For example, in an embodiment, the array may include a plurality of protrusions having a diameter of from about 1% of the surface area of the substrate to about the full surface area of the substrate, such as from about 10% of the surface area of the substrate to about 90% of the surface area of the substrate, or from about 20% of the surface area of substrate to about 80% of the surface area of the substrate.

In other embodiments, the array may include a plurality of protrusions having in which each of the individual protrusions has a center-to-center distance of from about 500 nanometers to about 200 microns from the closest adjacent protrusion, or a center-to-center distance of from about 1 micron to about 100 microns from the closest adjacent protrusion. The surface pattern may include protrusions being of equidistance from one another in an evenly distributed pattern across the surface of the substrate and forming a uniform roughened pattern on the surface of the substrate.

In addition, the methods of the present disclosure may be used to produce various surface patterns (arrangements) comprising combinations of various arrays of protrusions or bumps. Such combinations of various arrays of protrusions or bumps may include one or more arrays of ridges, lines, circles, rods, squares, triangles, polygons, mixtures thereof and the like.

Molecular Building Block

The SOFs of the present disclosure comprise molecular building blocks having a segment (S) (which may also be referred to as a segment type) and functional groups (Fg).

Molecular building blocks require at least two functional groups ($x \geqq 2$) and may comprise a single type or two or more types of functional groups. Functional groups are the reactive chemical moieties of molecular building blocks that participate in a chemical reaction to link together segments during the SOF forming process. A segment is the portion of the molecular building block that supports functional groups and comprises all atoms that are not associated with functional groups. Further, the composition of a molecular building block segment remains unchanged after SOF formation.

Functional Group

Functional groups are the reactive chemical moieties of molecular building blocks that may participate in a chemical reaction to link together segments during the SOF forming process. Functional groups may be composed of a single atom, or functional groups may be composed of more than one atom. The atomic compositions of functional groups are those compositions normally associated with reactive moieties in chemical compounds. Non-limiting examples of functional groups include halogens, alcohols, ethers, ketones, carboxylic acids, esters, carbonates, amines, amides, imines, ureas, aldehydes, isocyanates, tosylates, alkenes, alkynes and the like.

Molecular building blocks contain a plurality of chemical moieties, but only a subset of these chemical moieties are intended to be functional groups during the SOF forming process. Whether or not a chemical moiety is considered a functional group depends on the reaction conditions selected for the SOF forming process. Functional groups (Fg) denote a chemical moiety that is a reactive moiety, that is, a functional group during the SOF forming process.

In the SOF forming process the composition of a functional group will be altered through the loss of atoms, the gain of atoms, or both the loss and the gain of atoms; or, the functional group may be lost altogether. In the SOF, atoms previously associated with functional groups become associated with linker groups, which are the chemical moieties that join together segments. Functional groups have characteristic chemistries and those of ordinary skill in the art can generally recognize in the present molecular building blocks the atom(s) that constitute functional group(s). It should be noted that an atom or grouping of atoms that are identified as part of the molecular building block functional group may be preserved in the linker group of the SOF. Linker groups are described below.

Capping Unit

When a capping unit is introduced into the SOF, the SOF framework is locally 'interrupted' where the capping units are present. These SOF compositions are 'covalently doped' because a foreign molecule is bonded to the SOF framework when capping units are present. Capped SOF compositions may alter the properties of SOFs without changing constituent building blocks. For example, the mechanical and physical properties of the capped SOF where the SOF framework is interrupted may differ from that of an uncapped SOF. Capped SOF compositions are tunable materials whose properties can be varied through the type and amount of capping unit introduced. Capping units may comprise a single type or two or more types of functional groups and/or chemical moieties.

In embodiments, the capping units have a structure that is unrelated to the structure of any of the molecular building blocks that are added into the SOF formulation, which (after film formation) ultimately becomes the SOF.

In embodiments, the capping units have a structure that substantially corresponds to the structure of one of the molecular building blocks (such as the molecular building blocks for SOFs that are detailed in U.S. patent application Ser. Nos. 12/716,524; 12/716,449; 12/716,706; 12/716,324; 12/716,686; 12/716,571; 12/815,688; 12/845,053; 12/845,235; 12/854,962; 12/854,957; 12/845,052, 13/042,950, 13/173,948, 13/181,761, 13/181,912, 13/174,046, and 13/182,047, which have been incorporated by reference) that is added to the SOF formulation, but one or more of the functional groups present on the building block is either missing or has been replaced with a different chemical moiety or functional group that will not participate in a chemical reaction (with the functional group(s) of the building blocks that are initially present) to link together segments during the SOF forming process.

In embodiments, a capping unit may be bonded in the SOF in any desired amount as long as the general SOF framework is sufficiently maintained. For example, in embodiments, a capping unit may be bonded to at least 0.1% of all linkers, but not more than about 40% of all linkers present in an SOF, such as from about 0.5% to about 30%, or from about 2% to about 20%. In the event capping units bond to more than 50% of the available functional groups on the molecular building blocks (from which the linkers emerge), oligomers, linear polymers, and molecular building blocks that are fully capped with capping units may predominately form instead of a SOF.

Segment

A segment is the portion of the molecular building block that supports functional groups and comprises all atoms that are not associated with functional groups. Further, the composition of a molecular building block segment remains unchanged after SOF formation. In embodiments, the SOF may contain a first segment having a structure the same as or different from a second segment. In other embodiments, the structures of the first and/or second segments may be the same as or different from a third segment, forth segment, fifth segment, etc. A segment is also the portion of the molecular building block that can provide an inclined property. Inclined properties are described later in the embodiments.

The SOF of the present disclosure comprise a plurality of segments including at least a first segment type and a plurality of linkers including at least a first linker type arranged as a covalent organic framework (COF) having a plurality of pores, wherein the first segment type and/or the first linker type comprises at least one atom that is not carbon. In embodiments, the segment (or one or more of the segment types included in the plurality of segments making up the SOF) of the SOF comprises at least one atom of an element that is not carbon, such as where the structure of the segment comprises at least one atom selected from the group consisting of hydrogen, oxygen, nitrogen, silicon, phosphorous, selenium, fluorine, boron, and sulfur.

A description of various exemplary molecular building blocks, linkers, SOF types, strategies to synthesize a specific SOF type with exemplary chemical structures, building blocks whose symmetrical elements are outlined, and classes of exemplary molecular entities and examples of members of each class that may serve as molecular building blocks for SOFs are detailed in U.S. patent application Ser. Nos. 12/716,524; 12/716,449; 12/716,706; 12/716,324; 12/716,686; 12/716,571; 12/815,688; 12/845,053; 12/845,235; 12/854,962; 12/854,957; 12/845,052, 13/042,950, 13/173,948, 13/181,761, 13/181,912, 13/174,046, and 13/182,047, the disclosures of which are totally incorporated herein by reference in their entireties.

Linker

A linker is a chemical moiety that emerges in a SOF upon chemical reaction between functional groups present on the molecular building blocks and/or capping unit.

A linker may comprise a covalent bond, a single atom, or a group of covalently bonded atoms. The former is defined as a covalent bond linker and may be, for example, a single covalent bond or a double covalent bond and emerges when functional groups on all partnered building blocks are lost entirely. The latter linker type is defined as a chemical moiety linker and may comprise one or more atoms bonded together by single covalent bonds, double covalent bonds, or combinations of the two. Atoms contained in linking groups originate from atoms present in functional groups on molecular building blocks prior to the SOF forming process. Chemical moiety linkers may be well-known chemical groups such as, for example, esters, ketones, amides, imines, ethers, urethanes, carbonates, and the like, or derivatives thereof.

For example, when two hydroxyl (—OH) functional groups are used to connect segments in a SOF via an oxygen atom, the linker would be the oxygen atom, which may also be described as an ether linker. In embodiments, the SOF may contain a first linker having a structure the same as or different from a second linker. In other embodiments, the structures of the first and/or second linkers may be the same as or different from a third linker, etc.

The SOF of the present disclosure comprise a plurality of segments including at least a first segment type and a plurality of linkers including at least a first linker type arranged as a covalent organic framework (COF) having a plurality of pores, wherein the first segment type and/or the first linker type comprises at least one atom that is not carbon. In embodiments, the linker (or one or more of the plurality of linkers) of the SOF comprises at least one atom of an element that is not carbon, such as where the structure of the linker comprises at least one atom selected from the group consisting of hydrogen, oxygen, nitrogen, silicon, phosphorous, selenium, fluorine, boron, and sulfur.

Metrical Parameters of SOFs

SOFs have any suitable aspect ratio. In embodiments, SOFs have aspect ratios for instance greater than about 30:1 or greater than about 50:1, or greater than about 70:1, or greater than about 100:1, such as about 1000:1. The aspect ratio of a SOF is defined as the ratio of its average width or diameter (that is, the dimension next largest to its thickness) to its average thickness (that is, its shortest dimension). The term 'aspect ratio,' as used here, is not bound by theory. The longest dimension of a SOF is its length and it is not considered in the calculation of SOF aspect ratio.

In embodiments, the SOFs described in the of the present disclosure, such as, for example, when SOFs are used as substrates in the methods of the present disclosure, may have the following illustrative thicknesses: about 10 Angstroms to about 250 Angstroms, such as about 20 Angstroms to about 200 Angstroms, for a mono-segment thick layer and about 20 nm to about 5 mm, about 50 nm to about 10 mm for a multi-segment thick layer. In further embodiments, the SOFs produced by the ink jet methods of the present disclosure may have a thickness from about 50 nanometers to about 15 microns, or from about 500 nanometers to about 10 microns, or from about 800 nanometers to about 5 microns, or from about 1 micron to about 2 microns.

SOF dimensions may be measured using a variety of tools and methods. For a dimension about 1 micrometer or less, scanning electron microscopy is the preferred method. For a dimension about 1 micrometer or greater, a micrometer (or ruler) is the preferred method.

Multilayer SOFs

A SOF may comprise a single layer or a plurality of layers (that is, two, three or more layers). SOFs that are comprised of a plurality of layers may be physically joined (e.g., dipole and hydrogen bond) or chemically joined. Physically attached layers are characterized by weaker interlayer interactions or adhesion; therefore physically attached layers may be susceptible to delamination from each other. Chemically attached layers are expected to have chemical bonds (e.g., covalent or ionic bonds) or have numerous physical or intermolecular (supramolecular) entanglements that strongly link adjacent layers.

In the embodiments, the SOF may be a single layer (mono-segment thick or multi-segment thick) or multiple layers (each layer being mono-segment thick or multi-segment thick). "Thickness" refers, for example, to the smallest dimension of the film. As discussed above, in a SOF, segments are molecular units that are covalently bonded through linkers to generate the molecular framework of the film. The thickness of the film may also be defined in terms of the number of segments that is counted along that axis of the film when viewing the cross-section of the film. A "monolayer" SOF is the simplest case and refers, for example, to where a film is one segment thick. A SOF where two or more segments exist along this axis is referred to as a "multi-segment" thick SOF.

An exemplary method for preparing physically stacked multi-layer SOF nano- to micron-scale surface-structures may include the use of an inkjet method to deposit any of the reaction mixtures an a desired pattern or arrangement, such a method including: (1) providing a substrate, such as an outer layer of a photoreceptor, which may include forming a base SOF layer that may be cured by a first curing cycle, and (2) forming upon the base layer a second reactive wet layer, which is deposited by an ink jet method, followed by a second curing cycle and, if desired, repeating the second step to form a third layer, a forth layer and so on. In embodiments, the step may be repeated such that the SOF reaction mixture is ink jetted on top of one or more of the previously formed SOF nano- to micron-scale surface-structures that were deposited in an earlier step. In embodiments, such SOF reaction mixture compositions that are deposited may be the same or different from those the SOF reaction mixture deposited in a previous step.

The physically stacked multi-layer SOF nano- to micron-scale surface-structures produced by ink jet methods may have thicknesses greater than about 20 Angstroms such as, for example, the following illustrative thicknesses: about 20 Angstroms to about 500 microns, such as about 1 mm to about 100 microns, or about 100 nm to about 50 microns. However, in principle there is no limit with this process to the number of layers that may be physically stacked.

An exemplary method for preparing physically stacked multi-layer SOF nano- to micron-scale surface-structures may include: (1) providing a substrate, such as an outer layer of a photoreceptor, which may include forming a base SOF layer, such that this base layer has functional groups present on the surface (or dangling functional groups), and (2) forming upon the base layer a second SOF layer from a second reactive wet layer, which is deposited by an ink jet method, that comprises molecular building blocks with functional groups capable of reacting with the dangling functional groups on the surface of the base SOF layer and, if desired, repeating the second step to form a third layer, a forth layer and so on.

In further embodiments, a capped SOF may serve as the base layer in which the functional groups present that were not suitable or complementary to participate in the specific chemical reaction to link together segments during the base layer SOF forming process may be available for reacting with the molecular building blocks of the second layer to form a chemically bonded multilayer SOF. If desired, the formulation used to form the ink jetted second SOF layer should comprise molecular building blocks with functional groups capable of reacting with the functional groups from the base layer as well as additional functional groups that will allow for a third layer to be chemically attached to the second layer. The chemically stacked multilayer SOFs may have thicknesses greater than about 20 Angstroms such as, for example, the following illustrative thicknesses about 20 Angstroms to about 500 microns, such as about 1 nm to about 100 microns, or about 100 nm to about 50 microns. However, in principle there is no limit with this process to the number of layers that may be chemically stacked.

In embodiments, the method for preparing chemically attached ink jetted multilayer SOF comprises promoting chemical attachment of a second SOF onto an existing SOF (base layer) by using a small excess of one molecular building block (when more than one molecular building block is present) during the process used to form the SOF (base layer) whereby the functional groups present on this molecular building block will be present on the base layer surface. The surface of base layer may be treated with an agent to enhance the reactivity of the functional groups or to create an increased number of functional groups.

In an embodiment the dangling functional groups or chemical moieties present on, the surface of an SOF or capped SOF may be altered to increase the propensity for covalent attachment (or, alternatively, to disfavor covalent attachment) of particular classes of molecules or individual molecules, such as SOFs, to a base layer or any additional substrate or SOF layer. For example, the surface of a base layer, such as an SOF layer, which may contain reactive dangling functional groups, may be rendered pacified through surface treatment with a capping chemical group. For example, a SOF layer having dangling hydroxyl alcohol groups may be pacified by treatment with trimethylsiylchloride thereby capping hydroxyl groups as stable trimethylsilylethers. Alternatively, the surface of base layer may be treated with a non-chemically bonding agent, such as a wax, to block reaction with dangling functional groups from subsequent layers.

Molecular Building Block Symmetry

Molecular building block symmetry relates to the positioning of functional groups (Fgs) around the periphery of the molecular building block segments. Without being bound by chemical or mathematical theory, a symmetric molecular building block is one where positioning of Fgs may be associated with the ends of a rod, vertexes of a regular geometric shape, or the vertexes of a distorted rod or distorted geometric shape. For example, the most symmetric option for molecular building blocks containing four Fgs are those whose Fgs overlay with the corners of a square or the apexes of a tetrahedron.

Use of symmetrical building blocks is practiced in embodiments of the present disclosure for two reasons: (1) the patterning of molecular building blocks may be better anticipated because the linking of regular shapes is a better understood process in reticular chemistry, and (2) the complete reaction between molecular building blocks is facilitated because for less symmetric building blocks errant conformations/orientations may be adopted which can possibly initiate numerous linking defects within SOFs.

Figure 1O:
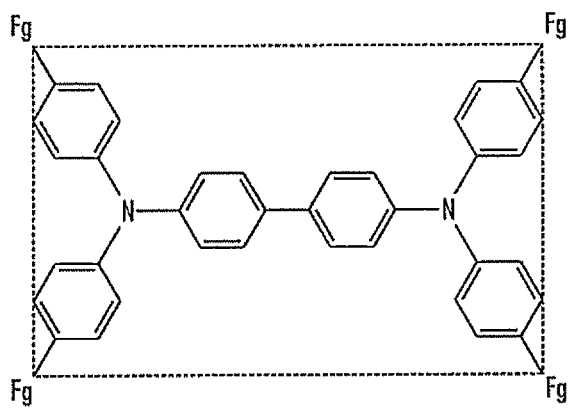

FIGS. 1A-O illustrate exemplary building blocks whose symmetrical elements are outlined. Such symmetrical elements are found in building blocks that may be used in the present disclosure.

Non-limiting examples of various classes of exemplary molecular entities that may serve as molecular building blocks for SOFs of the present disclosure include building blocks containing a carbon or silicon atomic core; building blocks containing alkoxy cores; building blocks containing a nitrogen or phosphorous atomic core; building blocks containing aryl cores; building blocks containing carbonate cores; building blocks containing carbocyclic-, carbobicyclic-, or carbotricyclic core; and building blocks containing an oligothiophene core. Incorporation of one or more of the above molecular building blocks in the porous SOF reaction mixture may result in a porous SOF with a plurality of segments having one or more cores selected from the group consisting of carbon, nitrogen, silicon, or phosphorous atomic cores, alkyl cores, fluoroalkyl cores, alkoxy cores, aryl cores, carbonate cores, carbocyclic cores, carbobicyclic cores, carbotricyclic cores, and oligothiophene cores, respectively.

In embodiments, the Type 1 SOF contains segments, which are not located at the edges of the SOF, that are connected by linkers to at least three other segments. For example, in embodiments the SOF comprises at least one symmetrical building block selected from the group consisting of ideal triangular building blocks, distorted triangular building blocks, ideal tetrahedral building blocks, distorted tetrahedral building blocks, ideal square building blocks, and distorted square building blocks. In embodiments, Type 2 and 3 SOF contains at least one segment type, which are not located at the edges of the SOF, that are connected by linkers to at least three other segments. For example, in embodiments the SOF comprises at least one symmetrical building block selected from the group consisting of ideal triangular building blocks, distorted triangular building blocks, ideal tetrahedral building blocks, distorted tetrahedral building blocks, ideal square building blocks, and distorted square building blocks.

Practice of Linking Chemistry

In embodiments, linking chemistry may occur wherein the reaction between functional groups produces a volatile byproduct that may be largely evaporated or expunged from the SOF during or after the film forming process or wherein no byproduct is formed. Linking chemistry may be selected to achieve a SOF for applications where the presence of linking chemistry byproducts is not desired. Linking chemistry reactions may include, for example, condensation, addition/elimination, and addition reactions, such as, for example, those that produce esters, imines, ethers, carbonates, urethanes, amides, acetals, and silyl ethers.

In embodiments the linking chemistry via a reaction between function groups producing a non-volatile byproduct that largely remains incorporated within the SOF after the film forming process. Linking chemistry in embodiments may be selected to achieve a SOF for applications where the presence of linking chemistry byproducts does not impact the properties or for applications where the presence of linking chemistry byproducts may alter the properties of a SOF (such as, for example, the electroactive, hydrophobic or hydrophilic nature of the SOF). Linking chemistry reactions may include, for example, substitution, metathesis, and metal catalyzed coupling reactions, such as those that produce carbon-carbon bonds.

For all linking chemistry the ability to control the rate and extent of reaction between building blocks via the chemistry between building block functional groups is an important aspect of the present disclosure. Reasons for controlling the rate and extent of reaction may include adapting the film forming process for different coating methods and tuning the microscopic arrangement of building blocks to achieve a periodic SOF, as defined in earlier embodiments.

Innate Properties of COFs

COFs have innate properties such as high thermal stability (typically higher than 400° C. under atmospheric conditions); poor solubility in organic solvents (chemical stability), and porosity (capable of reversible guest uptake). In embodiments, SOFs may also possess these innate properties.

An Inclined Property of a Molecular Building Block

The term "inclined property" of a molecular building block refers, for example, to a property known to exist for certain molecular compositions or a property that is reasonably identifiable by a person skilled in art upon inspection of the molecular composition of a segment. As used herein, the terms "inclined property" and "added functionality" refer to the same general property (e.g., hydrophobic, electroactive, etc.) but "inclined property" is used in the context of the molecular building block and "added functionality" is used in the context of the SOF.

The hydrophobic (superhydrophobic), hydrophilic, lipophobic (superlipophobic), lipophilic, photochromic and/or electroactive (conductor, semiconductor, charge transport material) nature of an SOF are some examples of the properties that may represent an "added functionality" of an SOF. These and other added functionalities may arise from the inclined properties of the molecular building blocks or may arise from building blocks that do not have the respective added functionality that is observed in the SOF.

The term hydrophobic (superhydrophobic) refers, for example, to the property of repelling water, or other polar species, such as methanol, it also means an inability to absorb water and/or to swell as a result. Furthermore, hydrophobic implies an inability to form strong hydrogen bonds to water or other hydrogen bonding species. Hydrophobic materials are typically characterized by having water contact angles greater than 90° as measured using a contact angle goniometer or related device. Highly hydrophobic as used herein can be described as when a droplet of water forms a high contact angle with a surface, such as a contact angle of from about 130° to about 180°. Superhydrophobic as used herein can be described as when a droplet of water forms a high contact angle with a surface, such as a contact angle of greater than about 150°, or from greater about 150° to about 180°.

Superhydrophobic as used herein can be described as when a droplet of water forms a sliding angle with a surface, such as a sliding angle of from about 1° to less than about 30°, or from about 1° to about 25°, or a sliding angle of less than about 15°, or a sliding angle of less than about 10°.

The term hydrophilic refers, for example, to the property of attracting, adsorbing, or absorbing water or other polar species, or a surface that is easily wetted by such species. Hydrophilic materials are typically characterized by having less than 20° water contact angle as measured using a contact angle goniometer or related device. Hydrophilicity may also be characterized by swelling of a material by water or other polar species, or a material that can diffuse or transport water, or other polar species, through itself. Hydrophilicity, is further characterized by being able to form strong or numerous hydrogen bonds to water or other hydrogen bonding species.

The term lipophobic (oleophobic) refers, for example, to the property of repelling oil or other non-polar species such as alkanes, fats, and waxes. Lipophobic materials are typically characterized by having oil contact angles greater than 90° as measured using a contact angle goniometer or related device. In the present disclosure, the term oleophobic refers, for example, to wettability of a surface that has an oil contact angle of approximately about 55° or greater, for example, with UV gel ink, solid ink, hexadecane, dodecane, hydrocarbons, etc. Highly oleophobic as used herein can be described as when a droplet of hydrocarbon-based liquid, for example, hexadecane or ink, forms a high contact angle with a surface, such as a contact angle of from about 130° or greater than about 130° to about 175° or from about 135° to about 170°.

Superoleophobic as used herein can be described as when a droplet of hydrocarbon-based liquid, for example, ink, forms a high contact-angle with a surface, such as a contact angle that is greater than 150°, or from greater than about 150° to about 175°, or from greater than about 150° to about 160°.

Superoleophobic as used herein can also be described as when a droplet of a hydrocarbon-based liquid, for example, hexadecane, forms a sliding angle with a surface of from about 1° to less than about 30°, or from about 1° to less than about 25°, or a sliding angle of less than about 25°, or a sliding angle of less than about 15°, or a sliding angle of less than about 10°.

The term lipophilic (oleophilic) refers, for example, to the property attracting oil or other non-polar species such as alkanes, fats, and waxes or a surface that is easily wetted by such species. Lipophilic materials are typically characterized by having a low to nil oil contact angle as measured using, for example, a contact angle goniometer. Lipophilicity can also be characterized by swelling of a material by hexane or other non-polar liquids.

The term photochromic refers, for example, to the ability to demonstrate reversible color changes when exposed to electromagnetic radiation. SOF compositions containing photochromic molecules may be prepared and demonstrate reversible color changes when exposed to electromagnetic radiation. These SOFs may have the added functionality of photochromism. The robustness of photochromic SOFs may enable their use in many applications, such as photochromic SOFs for erasable paper, and light responsive films for window tinting/shading and eye wear. SOF compositions may contain any suitable photochromic molecule, such as a difunctional photochromic molecules as SOF molecular building blocks (chemically bound into SOF structure), a monofunctional photochromic molecules as SOF capping units (chemically bound into SOF structure, or unfunctionalized photochromic molecules in an SOF composite (not chemically bound into SOF structure). Photochromic SOFs may change color upon exposure to selected wavelengths of light and the color change may be reversible.

SOF compositions containing photochromic molecules that chemically bond to the SOF structure are exceptionally chemically and mechanically robust photochromic materials. Such photochromic SOF materials demonstrate many superior properties, such as high number of reversible color change processes, to available polymeric alternatives.

The term electroactive refers, for example, to the property to transport electrical charge (electrons and/or holes). Electroactive materials include conductors, semiconductors, and charge transport materials. Conductors are defined as materials that readily transport electrical charge in the presence of a potential difference. Semiconductors are defined as materials do not inherently conduct charge but may become conductive in the presence of a potential difference and an applied stimuli, such as, for example, an electric field, electromagnetic radiation, heat, and the like. Charge transport materials are defined as materials that can transport charge when charge is injected from another material such as, for example, a dye, pigment, or metal in the presence of a potential difference.

Conductors may be further defined as materials that give a signal using a potentiometer from about 0.1 to about $10^7$ S/cm.

Semiconductors may be further defined as materials that give a signal using a potentiometer from about $10^{-6}$ to about $10^4$ S/cm in the presence of applied stimuli such as, for example an electric field, electromagnetic radiation, heat, and the like. Alternatively, semiconductors may be defined as materials having electron and/or hole mobility measured using time-of-flight techniques in the range of $10^{-10}$ to about $10^6$ cm$^2$V$^{-1}$s$^{-1}$ when exposed to applied stimuli such as, for example an electric field, electromagnetic radiation, heat, and the like.

Charge transport materials may be further defined as materials that have electron and/or hole mobility measured using time-of-flight techniques in the range of $10^{-10}$ to about $10^6$ cm$^2$V$^{-1}$s$^{-1}$. It should be noted that under some circumstances charge transport materials may be also classified as semiconductors.

SOFs with hydrophobic added functionality may be prepared by using molecular building blocks with inclined hydrophobic properties and/or have a rough, textured, or porous surface on the sub-micron to micron scale. A paper describing materials having a rough, textured, or porous surface on the sub-micron to micron scale being hydrophobic was authored by Cassie and Baxter (Cassie, A. B. D.; Baxter, S. *Trans. Faraday Soc.*, 1944, 40, 546).

Molecular building blocks comprising or bearing highly-fluorinated segments have inclined hydrophobic properties and may lead to SOFs with hydrophobic added functionality. Highly-fluorinated segments are defined as the number of fluorine atoms present on the segment(s) divided by the number of hydrogen atoms present on the segment(s) being greater than one. Fluorinated segments, which are not highly-fluorinated segments may also lead to SOFs with hydrophobic added functionality.

The above-mentioned fluorinated segments may include, for example, tetrafluorohydroquinone, perfluoroadipic acid hydrate, 4,4'-(hexafluoroisopropylidene)diphthalic anhydride, 4,4'-(hexafluoroisopropylidene)diphenol, and the like. Other exemplary fluorinated SOFs are described in U.S. patent application Ser. No. 13/173,948, to Adrien P. Cote and Matthew A. Heuft entitled "Fluorinated Structured Organic Film Compositions," the disclosure of which is totally incorporated herein by reference in its entirety.

SOFs having a rough, textured, or porous surface on the sub-micron to micron scale may also be hydrophobic. The rough, textured, or porous SOF surface can result from dangling functional groups present on the film surface or from the structure of the SOF. The type of pattern and degree of patterning depends on the geometry of the molecular building blocks and the linking chemistry efficiency. The feature size that leads to surface roughness or texture is from about 100 nm to about 10 μm, such as from about 500 nm to about 5 μm.

SOFs with hydrophilic added functionality may be prepared by using molecular building blocks with inclined hydrophilic properties and/or comprising polar linking groups.

Molecular building blocks comprising segments bearing polar substituents have inclined hydrophilic properties and may lead to SOFs with hydrophilic added functionality. The term polar substituents refers, for example, to substituents that can form hydrogen bonds with water and include, for example, hydroxyl, amino, ammonium, and carbonyl (such as ketone, carboxylic acid, ester, amide, carbonate, urea).

SOFs with electroactive added functionality may be prepared by using molecular building blocks with inclined electroactive properties and/or be electroactive resulting from the assembly of conjugated segments and linkers. The following sections describe molecular building blocks with inclined hole transport properties, inclined electron transport properties, and inclined semiconductor properties.

SOFs with hole transport added functionality may be obtained by selecting segment cores such as, for example, triarylamines, hydrazones (U.S. Pat. No. 7,202,002 B2 to Tokarski et al.), and enamines (U.S. Pat. No. 7,416,824 B2 to Kondoh et al.) with the following general structures:

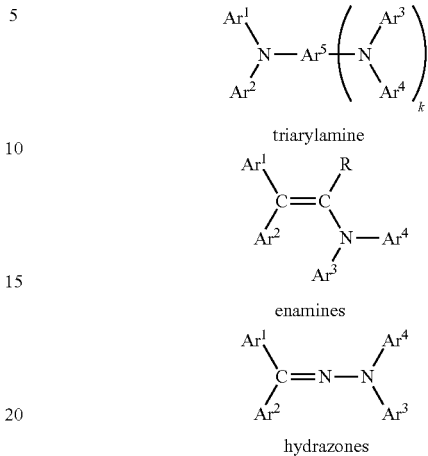

triarylamine enamines hydrazones

The segment core comprising a triarylamine being represented by the following general formula:

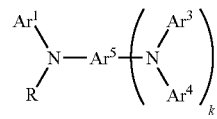

wherein Ar$^1$, Ar$^2$, Ar$^3$, Ar$^4$ and Ar$^5$ each independently represents a substituted or unsubstituted aryl group, or Ar$^5$ independently represents a substituted or unsubstituted arylene group, and k represents 0 or 1, wherein at least two of Ar$^1$, Ar$^2$, Ar$^3$, Ar$^4$ and Ar$^5$ comprises a Fg (previously defined). Ar$^5$ may be further defined as, for example, a substituted phenyl ring, substituted/unsubstituted phenylene, substituted/unsubstituted monovalently linked aromatic rings such as biphenyl, terphenyl, and the like, or substituted/unsubstituted fused aromatic rings such as naphthyl, anthranyl, phenanthryl, and the like.

Segment cores comprising arylamines with hole transport added functionality include, for example, aryl amines such as triphenylamine, N,N,N',N'-tetraphenyl-(1,1'-biphenyl)-4,4'-diamine, N,N'-diphenyl-N,N-bis(3-methylphenyl)-(1,1'-biphenyl)-4,4'-diamine, N,N'-bis(4-butylphenyl)-N,N'-diphenyl-[p-terphenyl]-4,4''-diamine; hydrazones such as N-phenyl-N-methyl-3-(9-ethyl)carbazyl hydrazone and 4-diethyl amino benzaldehyde-1,2-diphenyl hydrazone; and oxadiazoles such as 2,5-bis(4-N,N'-diethylaminophenyl)-1,2,4-oxadiazole, stilbenes, and the like.

The segment core comprising a hydrazone being represented by the following general formula:

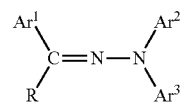

wherein Ar$^1$, Ar$^2$, and Ar$^3$ each independently represents an aryl group optionally containing one or more substituents, and R represents a hydrogen atom, an aryl group, or an alkyl group optionally containing a substituent; wherein at least two of Ar¹, Ar², and Ar³ comprises a Fg (previously defined); and a related oxadiazole being represented by the following general formula:

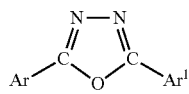

wherein Ar and Ar¹ each independently represent an aryl group that comprises a Fg (previously defined).

The segment core comprising an enamine being represented by the following general formula:

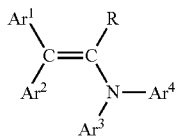

wherein Ar¹, Ar², Ar³, and Ar⁴ each independently represents an aryl group that optionally contains one or more substituents or a heterocyclic group that optionally contains one or more substituents, and R represents a hydrogen atom, an aryl group, or an alkyl group optionally containing a substituent; wherein at least two of Ar¹, Ar², Ar³, and Ar⁴ comprises a Fg (previously defined).

The SOF may be a p-type semiconductor, n-type semiconductor or ambipolar semiconductor. The SOF semiconductor type depends on the nature of the molecular building blocks. Molecular building blocks that possess an electron donating property such as alkyl, alkoxy, aryl, and amino groups, when present in the SOF, may render the SOF a p-type semiconductor. Alternatively, molecular building blocks that are electron withdrawing such as cyano, nitro, fluoro, fluorinated alkyl, and fluorinated aryl groups may render the SOF into the n-type semiconductor.

Similarly, the electroactivity of SOFs prepared by these molecular building blocks will depend on the nature of the segments, nature of the linkers, and how the segments are orientated within the SOF. Linkers that favor preferred orientations of the segment moieties in the SOF are expected to lead to higher electroactivity.

Process for Preparing a Structured Organic Film (SOF)

The process for making porous SOFs of the present disclosure typically comprises a number of activities or steps (set forth below) that may be performed in any suitable sequence or where two or more activities are performed simultaneously or in close proximity in time:

A process for preparing a structured organic film comprising:

(a) preparing a liquid-containing reaction mixture comprising a plurality of molecular building blocks each comprising a segment and a number of functional groups, and a pre-SOF;

(b) depositing the reaction mixture as a wet film (when depositing the reaction mixture by an ink jet method such a "wet film" may be as small as the size of an ink jetted droplet);

(c) promoting a change of the wet film including the molecular building blocks to a dry film comprising the SOF (dry SOF) comprising a plurality of the segments and a plurality of linkers arranged as a covalent organic framework, wherein at a macroscopic level the covalent organic framework is a film;

(d) optionally removing the SOF from the coating substrate to obtain a free-standing SOF;

(e) optionally processing the free-standing SOF into a roll;

(f) optionally cutting and seaming the SOF into a belt;

(g) optionally performing the above SOF formation process(es) upon an SOF (which was prepared by the above SOF formation process(es)) as a substrate for subsequent SOF formation process(es); and (h) optionally activating the above dry SOF in order to empty the plurality of pores and remove any residual chemical species that may remain after formation of the SOF.

The process for making capped SOFs and/or composite SOFs typically comprises a similar number of activities or steps (set forth above) that are used to make a non-capped SOF. The capping unit and/or secondary component may be added during either step a, b or c, depending the desired distribution of the capping unit in the resulting SOF. For example, if it is desired that the capping unit and/or secondary component distribution is substantially uniform over the resulting SOF, the capping unit may be added during step a. Alternatively, if, for example, a more heterogeneous distribution of the capping unit and/or secondary component is desired, adding the capping unit and/or secondary component (such as by spraying it on the film formed during step b or during the promotion step of step c) may occur during steps b and c.

The above activities or steps may be conducted at atmospheric, super atmospheric, or subatmospheric pressure. The term "atmospheric pressure" as used herein refers to a pressure of about 760 torr. The term "super atmospheric" refers to pressures greater than atmospheric pressure, but less than 20 atm. The term "subatmospheric pressure" refers to pressures less than atmospheric pressure. In an embodiment, the activities or steps may be conducted at or near atmospheric pressure. Generally, pressures of from about 0.1 atm to about 2 atm, such as from about 0.5 atm to about 1.5 atm, or 0.8 atm to about 1.2 atm may be conveniently employed.

Process Action A: Preparation of the Liquid-Containing Reaction Mixture

The reaction mixture comprises a plurality of molecular building blocks that are dissolved, suspended, or mixed in a liquid. The plurality of molecular building blocks may be of one type or two or more types. When one or more of the molecular building blocks is a liquid, the use of an additional liquid is optional. Catalysts may optionally be added to the reaction mixture to enable SOF formation or modify the kinetics of SOF formation during Action C described above. Additives or secondary components may optionally be added to the reaction mixture to alter the physical properties of the resulting SOF.

The reaction mixture components (molecular building blocks, optionally a capping unit, liquid, optionally catalysts, and optionally additives) are combined in a vessel. The order of addition of the reaction mixture components may vary; however, typically the catalyst is added last. In particular embodiments, the molecular building blocks are heated in the liquid in the absence of the catalyst to aid the dissolution of the molecular building blocks. The reaction mixture may also be mixed, stirred, milled, or the like, to ensure even distribution of the formulation components prior to depositing the reaction mixture as a wet film.

In embodiments, the reaction mixture may be heated prior to being deposited as a wet film. This may aid the dissolution of one or more of the molecular building blocks and/or increase the viscosity of the reaction mixture by the partial reaction of the reaction mixture prior to depositing the wet layer. This approach may be used to increase the loading of the molecular building blocks in the reaction mixture.

In particular embodiments, the reaction mixture needs to have a viscosity that will support the deposited wet layer. Reaction mixture viscosities range from about 10 to about 50,000 cps, such as from about 25 to about 25,000 cps or from about 50 to about 1000 cps. In embodiments, the reaction mixture needs to have a viscosity that will allow for the deposition of the reaction mixture via an inkjet method. Such reaction mixture viscosities range from about 2 cps to about 30 cps, such as from about 3 to about 14 cps or from 4 to about 10 cps.

The molecular building block and capping unit loading or "loading" in the reaction mixture is defined as the total weight of the molecular building blocks and optionally the capping units and catalysts divided by the total weight of the reaction mixture. The molecular building block and/or capping unit loading that may be ink jetted will vary depending on the specific building blocks and or capping units. In specific embodiments, such loadings that may be ink jetted the may range from about 1 to 50%, such as from about 3 to about 30%, or from about 5 to about 15%.

In embodiments, the theoretical upper limit for capping unit molecular building loading in the reaction mixture (liquid SOF formulation) is the molar amount of capping units that reduces the number of available linking groups to two per molecular building block in the liquid SOF formulation. In such a loading, substantial SOF formation may be effectively inhibited by exhausting (by reaction with the respective capping group) the number of available linkable functional groups per molecular building block. For example, in such a situation (where the capping unit loading is in an amount sufficient to ensure that the molar excess of available linking groups is less than 2 per molecular building block in the liquid SOF formulation), oligomers, linear polymers, and molecular building blocks that are fully capped with capping units may predominately form instead of an SOF.

Liquids used in the reaction mixture may be pure liquids, such as solvents, and/or solvent mixtures. Liquids are used to dissolve or suspend the molecular building blocks and catalyst/modifiers in the reaction mixture. Liquid selection is generally based on balancing the solubility/dispersion of the molecular building blocks and a particular building block loading, the viscosity of the reaction mixture, and the boiling point of the liquid, which impacts the promotion of the wet layer to the dry SOF. Suitable liquids may have boiling points from about 30 to about 300° C., such as from about 65° C. to about 250° C., or from about 100° C. to about 180° C.

Liquids can include molecule classes such as alkanes (hexane, heptane, octane, nonane, decane, cyclohexane, cycloheptane, cyclooctane, decalin); mixed alkanes (hexanes, heptanes); branched alkanes (isooctane); aromatic compounds (toluene, o-, m-, p-xylene, mesitylene, nitrobenzene, benzonitrile, butylbenzene, aniline); ethers (benzyl ethyl ether, butyl ether, isoamyl ether, propyl ether); cyclic ethers (tetrahydrofuran, dioxane), esters (ethyl acetate, butyl acetate, butyl butyrate, ethoxyethyl acetate, ethyl propionate, phenyl acetate, methyl benzoate); ketones (acetone, methyl ethyl ketone, methyl isobutylketone, diethyl ketone, chloroacetone, 2-heptanone), cyclic ketones (cyclopentanone, cyclohexanone), amines (1°, 2°, or 3° amines such as butylamine, diisopropylamine, triethylamine, diisoproylethylamine; pyridine); amides (dimethylformamide, N-methylpyrrolidinone, N,N-dimethylformamide); alcohols (methanol, ethanol, n-, i-propanol, n-, t-butanol, 1-methoxy-2-propanol, hexanol, cyclohexanol, 3-pentanol, benzyl alcohol); nitriles (acetonitrile, benzonitrile, butyronitrile), halogenated aromatics (chlorobenzene, dichlorobenzene, hexafluorobenzene), halogenated alkanes (dichloromethane, chloroform, dichloroethylene, tetrachloroethane); and water.

Mixed liquids comprising a first solvent, second solvent, third solvent, and so forth may also be used in the reaction mixture. Two or more liquids may be used to aid the dissolution/dispersion of the molecular building blocks; and/or increase the molecular building block loading; and/or allow a stable wet film to be deposited by aiding the wetting of the substrate and deposition instrument; and/or modulate the promotion of the wet layer to the dry SOF. In embodiments, the second solvent is a solvent whose boiling point or vapor-pressure curve or affinity for the molecular building blocks differs from that of the first solvent. In embodiments, a first solvent has a boiling point higher than that of the second solvent. In embodiments, the second solvent has a boiling point equal to or less than about 100° C., such as in the range of from about 30° C. to about 100° C., or in the range of from about 40° C. to about 90° C., or about 50° C. to about 80° C.

The ratio of the mixed liquids may be established by one skilled in the art. The ratio of liquids a binary mixed liquid may be from about 1:1 to about 99:1, such as from about 1:10 to about 10:1, or about 1:5 to about 5:1, by volume. When n liquids are used, with n ranging from about 3 to about 6, the amount of each liquid ranges from about 1% to about 95% such that the sum of each liquid contribution equals 100%.

The term "substantially removing" refers to, for example, the removal of at least 90% of the respective solvent, such as about 95% of the respective solvent. The term "substantially leaving" refers to, for example, the removal of no more than 2% of the respective solvent, such as removal of no more than 1% of the respective solvent.

These mixed liquids may be used to slow or speed up the rate of conversion of the wet layer to the SOF in order to manipulate the characteristics of the SOFs. For example, in condensation and addition/elimination linking chemistries, liquids such as water, 1°, 2°, or 3° alcohols (such as methanol, ethanol, propanol, isopropanol, butanol, 1-methoxy-2-propanol, tert-butanol) may be used.

Optionally a catalyst may be present in the reaction mixture to assist the promotion of the wet layer to the dry SOF. Selection and use of the optional catalyst depends on the functional groups on the molecular building blocks. Catalysts may be homogeneous (dissolved) or heterogeneous (undissolved or partially dissolved) and include Brönsted acids (HCl (aq), acetic acid, p-toluenesulfonic acid, amine-protected p-toluenesulfonic acid such as pyrridium p-toluene-sulfonate, trifluoroacetic acid); Lewis acids (boron trifluoro-etherate, aluminum trichloride); Brönsted bases (metal hydroxides such as sodium hydroxide, lithium hydroxide, potassium hydroxide; 1°, 2°, or 3° amines such as butylamine, diisopropylamine, triethylamine, diisoproylethylamine); Lewis bases (N,N-dimethyl-4-aminopyridine); metals (Cu bronze); metal salts ($FeCl_3$, $AuCl_3$); and metal complexes (ligated palladium complexes, ligated ruthenium catalysts). Typical catalyst loading ranges from about 0.01% to about 25%, such as from about 0.1% to about 5% of the molecular building block loading in the reaction mixture. The catalyst may or may not be present in the final SOF composition.

Optionally additives or secondary components, such as dopants, may be present in the reaction mixture and wet layer. Such additives or secondary components may also be integrated into a dry SOF. Additives or secondary components can be homogeneous or heterogeneous in the reaction mixture and wet layer or in a dry SOF. In contrast to capping units, the terms "additive" or "secondary component," refer, for example, to atoms or molecules that are not covalently bound in the SOF, but are randomly distributed in the composition. Suitable secondary components and additives are described in U.S. patent application Ser. No. 12/716,324, entitled "Composite Structured Organic Films," the disclosure of which is totally incorporated herein by reference in its entirety.

Process Action B: Depositing the Reaction Mixture as a Wet Film

The reaction mixture may be applied as a wet film of any desired size, which may be as small as an individual ink jetted droplet, to a variety of substrates using a number of liquid deposition techniques, which include ink jet methods for producing the SOF micro-features. The thickness of the SOF, such as an SOF micro-feature, is dependent on the thickness of the wet film (and/or the size of the deposited droplet) and the molecular building block loading in the reaction mixture.

The size and shape of the desired feature, such as a microfeature, may be obtained by varying the viscosity, surface tension, and/or composition of the reaction mixture, along with the size of the droplet used to deposit the reaction mixture on the substrate. For example, in embodiments, the droplets of a lower viscosity reaction mixture may be deposited on the surface of a substrate having a surface tension (with respect to the reaction mixture) that would allow for the droplet to spread more readily to create thin flat SOF microfeatures that may conform to the shape of the portion of the substrate where the droplet is deposited, such as when the droplet is deposited in an indention of valley on the surface of the substrate. In embodiments, droplets of a high viscosity reaction mixture may be deposited on the surface of a substrate having a surface tension (with respect to the reaction mixture) that would not allow the droplet to readily spread, such that features that optionally protrude more from the surface of the substrate may be formed.

In embodiments, the methods for forming a structured organic film (SOF) micro-feature may comprise discharging a first (or second, third, forth, etc.,) droplet (where a first (or second, third, forth, etc.,) droplet may by an individual droplet or multiple droplets, such as one or more droplets, or a plurality of droplets) toward the substrate by an ink jet method and depositing at least one of the first droplets on a surface of the substrate at a first predetermined location (where the predetermined location may be in relation to the edges of the substrate and/or relative to another droplet and/or feature of already present on the substrate). In embodiments, the first droplets may include a first reaction mixture comprising a first plurality of molecular building blocks (which may or may not have the same chemical structure).

In embodiments, the methods for forming a structured organic film (SOF) micro-feature may comprise promoting a change in at least one of the deposited droplets to form at least one SOF micro-feature, the at least one SOF micro-feature comprising a plurality of segments including at least a first segment type and a plurality of linkers including at least a first linker type arranged as a covalent organic framework (COF) on the surface of the substrate. In embodiments, the SOF may be one or more of the SOFs that are described in U.S. patent application Ser. Nos. 12/716,524; 12/716,449; 12/716,706; 12/716,324; 12/716,686; 12/716,571; 12/815,688; 12/845,053; 12/845,235; 12/854,962; 12/854,957; 12/845,052, 13/042,950, 13/173,948, 13/181,761, 13/181,912, 13/174,046, and 13/182,047, the disclosures of which are totally incorporated herein by reference in their entireties.

In embodiments, the viscosity of the first reaction mixture is from about 2 cPs to about 30 cPs, such as from about 4 cPs to about 20 cPs, or from about 6 cPs to about 14 cPs and may be applied to the substrate by a suitable inkjet method may be selected from the group consisting of thermal inkjet methods, piezoelectric inkjet methods, and continuous inkjet methods, and the like.

In embodiments, the methods of the present disclosure may further comprise discharging a second (or third, forth, etc.) droplet toward the substrate by an ink jet method and depositing at least one of the second droplets on a surface of the substrate at a second (or third, forth, etc., respectively) predetermined location, the second (or third, forth, etc., respectively) droplets including a second (or third, forth, etc., respectively) reaction mixture comprising a second (or third, forth, etc., respectively) plurality of molecular building blocks. In embodiments, the second (or third, forth, etc.) plurality of molecular building blocks may have the same or different chemical structure (and or mixtures of chemical structures) as the first plurality of molecular building blocks. In such embodiments, the viscosity of the second reaction mixture may be from about 2 cPs to about 30 cPs, such as from about 4 cPs to about 20 cPs, or from about 6 cPs to about 14 cPs and may be applied to the substrate by a suitable inkjet method. In embodiments, the first reaction mixture may or may not be miscible with the second reaction mixture, or subsequently jetted or applied reaction mixture.

In embodiments, the viscosity of the second reaction mixture may be greater than or less than the viscosity of the first reaction mixture. In such embodiments, the chemical structure of (and/or mixture of specific building blocks contained in) the second plurality of molecular building blocks may be the same as or different from the first plurality of molecular building blocks. For example, in embodiments, the viscosity of the second reaction mixture may be less than the viscosity of the first reaction mixture (such as by employing different solvent ratios and/or loading percentages of molecular building blocks), and the chemical structure of the second plurality of molecular building blocks may be the same as the second plurality of molecular building blocks. In embodiments, the at least one second droplet may be deposited at a second predetermined position on the substrate (where the second predetermined location my be in relation to the edges of the substrate and/or relative to another droplet and/or feature of already present on the substrate), such as at a location directly on top of a previously deposited droplet (which may or may not have been reacted to form an SOF micro-feature) of the first reaction mixture, or a predetermined distance away from the a previously deposited droplet of the same or different reaction mixture.

In embodiments where in SOF micro-features are attached to an SOF substrate, the reaction mixture of the SOF substrate may be applied to a further substrate using a number of liquid deposition techniques including, for example, spin coating, blade coating, web coating, dip coating, cup coating, rod coating, screen printing, ink jet printing, spray coating, stamping and the like. The method used to deposit the wet layer depends on the nature, size, and shape of the substrate and the desired wet layer thickness, conformation and/or arrangement. The thickness of the wet layer can range from about 5 nm to about 500 μm, such as from about 10 nm to about 100 μm, or from about 50 nm to about 10 μm.

In embodiments, the capping unit and/or secondary component may be introduced following completion of the above described process action B. The incorporation of the capping unit and/or secondary component in this way may be accomplished by any means that serves to distribute the capping unit and/or secondary component homogeneously, heterogeneously, or as a specific pattern over the wet film. Following introduction of the capping unit and/or secondary component subsequent process actions may be carried out resuming with process action C.

For example, following completion of process action B (i.e., after the reaction mixture may be applied to the substrate), capping unit(s) and/or secondary components (dopants, additives, etc.) may be added to the wet layer by any suitable method, such as by distributing (e.g., dusting, spraying, pouring, sprinkling, etc, depending on whether the capping unit and/or secondary component is a particle, powder or liquid) the capping unit(s) and/or secondary component on the top the wet layer. The capping units and/or secondary components may be applied to the formed wet layer in a homogeneous or heterogeneous manner, including various patterns, wherein the concentration or density of the capping unit(s) and/or secondary component is reduced in specific areas, such as to form a pattern of alternating bands of high and low concentrations of the capping unit(s) and/or secondary component of a given width on the wet layer. In embodiments, the application of the capping unit(s) and/or secondary component to the top of the wet layer may result in a portion of the capping unit(s) and/or secondary component diffusing or sinking into the wet layer and thereby forming a heterogeneous distribution of capping unit(s) and/or secondary component within the thickness of the SOF, such that a linear or nonlinear concentration gradient may be obtained in the resulting SOF obtained after promotion of the change of the wet layer to a dry SOF. In embodiments, a capping unit(s) and/or secondary component may be added to the top surface of a deposited wet layer, which upon promotion of a change in the wet film, results in an SOF having an heterogeneous distribution of the capping unit(s) and/or secondary component in the dry SOF. Depending on the density of the wet film and the density of the capping unit(s) and/or secondary component, a majority of the capping unit(s) and/or secondary component may end up in the upper half (which is opposite the substrate) of the dry SOF or a majority of the capping unit(s) and/or secondary component may end up in the lower half (which is adjacent to the substrate) of the dry SOF.

Process Action C: Promoting the Change of Wet Film to the Dry SOF

The term "promoting" refers, for example, to any suitable technique to facilitate a reaction of the molecular building blocks, such as a chemical reaction of the functional groups of the building blocks. In the case where a liquid needs to be removed to form the dry film, "promoting" also refers to removal of the liquid. Reaction of the capping units, and molecular building blocks, and removal of the liquid can occur sequentially or concurrently. In embodiments, the capping unit may be added while the promotion of the change of the wet film to the dry SOF is occurring. In certain embodiments, the liquid is also one of the molecular building blocks and is incorporated into the SOF. The term "dry SOF" refers, for example, to substantially dry SOFs (such as capped SOFs), for example, to a liquid content less than about 5% by weight of the SOF, or to a liquid content less than 2% by weight of the SOF.

In embodiments, the dry SOF or a given region of the dry SOF (such as the surface to a depth equal to of about 10% of the thickness of the SOF or a depth equal to of about 5% of the thickness of the SOF, the upper quarter of the SOF, or the regions discussed above) the capping units are present in an amount equal to or greater than about 0.5%, by mole, with respect to the total moles of capping units and segments present, such as from about 1% to about 40%, or from about 2% to 25% by mole, with respect to the total moles of capping units and segments present. For example, when the capping units are present in an amount of about 0.5% by mole respect to the total moles of capping units and segments present, there would be about 0.05 mols of capping units and about 9.95 mols of segments present in the sample.

Promoting the wet layer to form a dry SOF may be accomplished by any suitable technique. Promoting the wet layer to form a dry SOF typically involves thermal treatment including, for example, oven drying, infrared radiation (IR), and the like with temperatures ranging from 40 to 350° C. and from 60 to 200° C. and from 85 to 160° C. The total heating time can range from about four seconds to about 24 hours, such as from one minute to 120 minutes, or from three minutes to 60 minutes.

IR promotion of the wet layer to the COF film may be achieved using an IR heater module mounted over a belt transport system. Various types of IR emitters may be used, such as carbon IR emitters or short wave IR emitters (available from Heraerus). Additional exemplary information regarding carbon IR emitters or short wave IR emitters is summarized in the following Table.

TABLE 1

Exemplary information: carbon IR emitters or short wave IR emitters.

| IR lamp | Peak Wavelength | Number of lamps | Module Power (kW) |
|---|---|---|---|
| Carbon | 2.0 micron | 2-twin tube | 4.6 |
| Short wave | 1.2-1.4 micron | 3-twin tube | 4.5 |

Process Action D: Optionally Removing the SOF from the Coating Substrate to Obtain a Free-Standing SOF In embodiments where in SOF micro-features are attached to an SOF substrate, SOF micro-features may be attached to SOF substrate either before or after removing the SOF from the underlying substrate. In embodiments, free-standing SOF with SOF micro-feature may be obtained when one or more micro-features are deposited (by an inkjet method) on a SOF, which optionally is supported by a substrate, such as a low adhesion substrate. Appropriate substrates that have low adhesion to the SOF may include, for example, metal foils, metalized polymer substrates, release papers and SOFs, such as SOFs prepared with a surface that has been altered to have a low adhesion or a decreased propensity for adhesion or attachment. Removal of the SOF (optionally having SOF micro-features) from the supporting substrate may be achieved in a number of ways by someone skilled in the art. For example, removal of the SOF from the substrate may occur by starting from a corner or edge of the film and optionally assisted by passing the substrate and SOF over a curved surface.

Process Action E: Optionally processing the free-standing SOF into a roll

Optionally, a free-standing SOF or a SOF supported by a flexible substrate may be processed into a roll. The SOF may be processed into a roll for storage, handling, and a variety of other purposes. The starting curvature of the roll may be selected such that neither the substrate SOF nor the optional SOF micro-features are not distorted or cracked during the rolling process.

Process Action F: Optionally Cutting and Seaming the SOF into a Shape, Such as a Belt The method for cutting and seaming the SOF is similar to that described in U.S. Pat. No. 5,455,136 issued on Oct. 3, 1995 (for polymer films), the disclosure of which is herein totally incorporated by reference. An SOF belt may be fabricated from a single SOF, a multi layer SOF or an SOF sheet cut from a web. Such sheets may be rectangular in shape or any particular shape as desired. All sides of the SOF(s) may be of the same length, or one pair of parallel sides may be longer than the other pair of parallel sides. The SOF(s) may be fabricated into shapes, such as a belt by overlap joining the opposite marginal end regions of the SOF sheet. A seam is typically produced in the overlapping marginal end regions at the point of joining. Joining may be affected by any suitable means. Typical joining techniques include, for example, welding (including ultrasonic), gluing, taping, pressure heat fusing and the like. Methods, such as ultrasonic welding, are desirable general methods of joining flexible sheets because of their speed, cleanliness (no solvents) and production of a thin and narrow seam.

Process Action G: Optionally Using a SOF as a Substrate for Subsequent SOF Formation Processes In embodiments, a SOF or a SOF having micro-features (or the individual SOF micro-feature) may be used as a substrate in the SOF forming process to afford a multi-layered structured organic film or multilayered SOF micro-feature. The layers of a multi-layered SOF may be chemically bound in or in physical contact. Chemically bound, multi-layered SOFs are formed when functional groups present on the substrate SOF surface can react with the molecular building blocks present in the deposited wet layer used to form the second structured organic film layer. Multi-layered SOFs in physical contact may not chemically bound to one another.

A SOF substrate or SOF micro-feature may optionally be chemically treated prior to the deposition of the wet layer to enable or promote chemical attachment of a second SOF layer to form a multi-layered structured organic film.

Alternatively, a SOF substrate or SOF micro-feature may optionally be chemically treated prior to the deposition of the wet layer to disable chemical attachment of a second SOF layer (surface pacification) to form a physical contact multi-layered SOF.

Other methods, such as lamination of two or more SOFs, may also be used to prepare physically contacted multi-layered SOFs.

Applications of SOFs in Imaging Members, Such as Photoreceptor Layers

Figure 2:
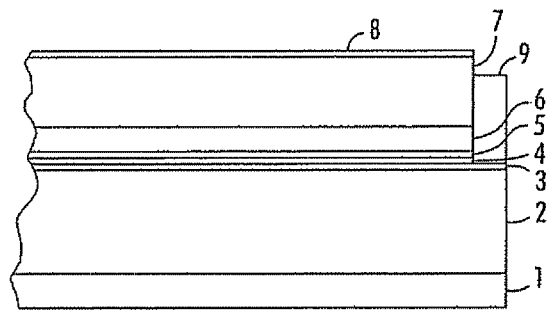
FIG. 2 represents a simplified side view of an exemplary photoreceptor that incorporates a SOF of the present disclosure.
Figure 3:
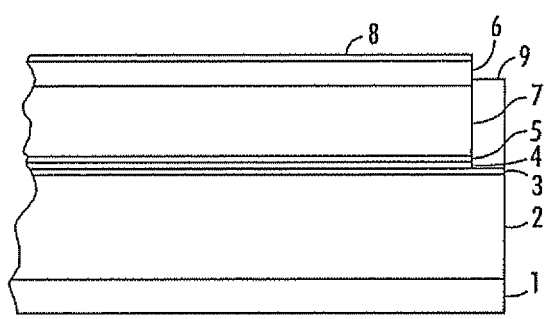
FIG. 3 represents a simplified side view of a second exemplary photoreceptor that incorporates a SOF of the present disclosure.
Figure 4:
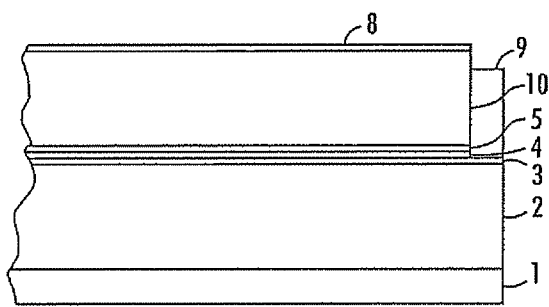
FIG. 4 represents a simplified side view of a third exemplary photoreceptor that incorporates a SOF of the present disclosure.

Representative structures of an electrophotographic imaging member (e.g., a photoreceptor) are shown in FIGS. 2-4. These imaging members are provided with an anti-curl layer 1, a supporting substrate 2, an electrically conductive ground plane 3, a charge blocking layer 4, an adhesive layer 5, a charge generating layer 6, a charge transport layer 7, an overcoating layer 8, and a ground strip 9. In FIG. 4, imaging layer 10 (containing both charge generating material and charge transport material) takes the place of separate charge generating layer 6 and charge transport layer 7.

As seen in the figures, in fabricating a photoreceptor, a charge generating material (CGM) and a charge transport material (CTM) may be deposited onto the substrate surface either in a laminate type configuration where the CGM and CTM are in different layers (e.g., FIGS. 2 and 3) or in a single layer configuration where the CGM and CTM are in the same layer (e.g., FIG. 4). In embodiments, the photoreceptors may be prepared by applying over the electrically conductive layer the charge generation layer 6 and, optionally, a charge transport layer 7. In embodiments, the charge generation layer and, when present, the charge transport layer, may be applied in either order.

SOF Charge Transport Layer

Illustrative charge transport SOFs include for example a positive hole transporting material selected from compounds having a segment containing a polycyclic aromatic ring such as anthracene, pyrene, phenanthrene, coronene, and the like, or a nitrogen-containing hetero ring such as indole, carbazole, oxazole, isoxazole, thiazole, imidazole, pyrazole, oxadiazole, pyrazoline, thiadiazole, triazole, and hydrazone compounds. Typical hole transport SOF segments include electron donor materials, such as carbazole; N-ethyl carbazole; N-isopropyl carbazole; N-phenyl carbazole; tetraphenylpyrene; 1-methyl pyrene; perylene; chrysene; anthracene; tetraphene; 2-phenyl naphthalene; azopyrene; 1-ethyl pyrene; acetyl pyrene; 2,3-benzochrysene; 2,4-benzopyrene; and 1,4-bromopyrene. Suitable electron transport SOF segments include electron acceptors such as 2,4,7-trinitro-9-fluorenone; 2,4,5,7-tetranitro-fluorenone; dinitroanthracene; dinitroacridene; tetracyanopyrene; dinitroanthraquinone; and butylcarbonylfluorenemalononitrile, see U.S. Pat. No. 4,921,769. Other hole transporting SOF segments include arylamines described in U.S. Pat. No. 4,265,990, such as N,N'-diphenyl-N,N'-bis(alkylphenyl)-(1,1'-biphenyl)-4,4'-diamine wherein alkyl is selected from the group consisting of methyl, ethyl, propyl, butyl, hexyl, and the like. Other known charge transport SOF segments may be selected, reference for example U.S. Pat. Nos. 4,921,773 and 4,464,450.

Generally, the thickness of the charge transport SOF layer is between about 5 micrometers to about 100 micrometers, such as about 10 micrometers to about 70 micrometers or 10 micrometers to about 40 micrometers. In general, the ratio of the thickness of the charge transport layer to the charge generating layer may be maintained from about 2:1 to 200:1 and in some instances as great as 400:1.

Single Layer P/R—SOF

The materials and procedures described herein may be used to fabricate a single imaging layer type photoreceptor containing a charge generating material and a charge transport SOF in which the SOF has been manufactured to have SOF nano- to micron-scale surface-structures. For example, the solids content in the dispersion for the single imaging layer may range from about 2% to about 30% by weight, based on the weight of the dispersion.

Where the imaging layer is a single layer combining the functions of the charge generating layer and the charge transport layer, illustrative amounts of the components contained therein are as follows: charge generating material (about 2% to about 40% by weight), with an inclined added functionality of charge transport molecular building block (about 20% to about 75% by weight).

The Overcoating Layer

Embodiments in accordance with the present disclosure can, optionally, further include an overcoating layer or layers 8, which, if employed, are positioned over the charge generation layer or over the charge transport layer. This layer comprises SOF nano- to micron-scale surface-structures that may be electrically insulating or slightly semi-conductive.

Such a protective overcoating layer may include a capped and/or composite SOF in which the SOF has been manufactured to have SOF nano- to micron-scale surface-structures.

Additives may be present in the overcoating layer in the range of about 0.5 to about 40 weight percent of the overcoating layer. In embodiments, additives include organic and inorganic particles which can further improve the wear resistance and/or provide charge relaxation property. In embodiments, organic particles include Teflon powder, carbon black, and graphite particles. In embodiments, inorganic particles include insulating and semiconducting metal oxide particles such as silica, zinc oxide, tin oxide and the like. Another semiconducting additive is the oxidized oligomer salts as described in U.S. Pat. No. 5,853,906 the disclosure of which is incorporated herein by reference in its entirety. In embodiments, oligomer salts are oxidized N,N,N',N'-tetra-p-tolyl-4,4'-biphenyldiamine salt.

Overcoating layers from about 2 micrometers to about 15 micrometers, such as from about 3 micrometers to about 8 micrometers are effective in preventing charge transport molecule leaching, crystallization, and charge transport layer cracking in addition to providing scratch and wear resistance.

The Ground Strip

The ground strip 9 may comprise a film-forming binder and electrically conductive particles. Cellulose may be used to disperse the conductive particles. Any suitable electrically conductive particles may be used in the electrically conductive ground strip layer 8. The ground strip 8 may, for example, comprise materials that include those enumerated in U.S. Pat. No. 4,664,995 the disclosure of which is incorporated herein by reference in its entirety. Typical electrically conductive particles include, for example, carbon black, graphite, copper, silver, gold, nickel, tantalum, chromium, zirconium, vanadium, niobium, indium tin oxide, and the like.

The electrically conductive particles may have any suitable shape. Typical shapes include irregular, granular, spherical, elliptical, cubic, flake, filament, and the like. In embodiments, the electrically conductive particles should have a particle size less than the thickness of the electrically conductive ground strip layer to avoid an electrically conductive ground strip layer having an excessively irregular outer surface. An average particle size of less than about 10 micrometers generally avoids excessive protrusion of the electrically conductive particles at the outer surface of the dried ground strip layer and ensures relatively uniform dispersion of the particles through the matrix of the dried ground strip layer. Concentration of the conductive particles to be used in the ground strip depends on factors such as the conductivity of the specific conductive materials utilized.

In embodiments, the ground strip layer may have a thickness of from about 7 micrometers to about 42 micrometers, such as from about 14 micrometers to about 27 micrometers.

In embodiments, an imaging member may comprise a SOF as the surface layer (OCL or CTL) optionally in which the SOF has been manufactured to have SOF nano- to micron-scale surface-structures. This imaging member may be a SOF that comprises N,N,N',N'-tetra-(methylenephenylene)biphenyl-4,4'-diamine and segments N,N,N',N'-tetraphenyl-terphenyl-4,4'-diamine segments. Such a capped SOF may be prepared from N,N,N',N'-tetrakis-[(4-hydroxymethyl)phenyl]-biphenyl-4,4'-diamine and N,N'-diphenyl-N,N'-bis-(3-hydroxyphenyl)-terphenyl-4,4'-diamine molecular building blocks. The SOF imaging member may also comprise N,N,N',N'-tetra-(methylenephenylene)biphenyl-4,4'-diamine and segments N,N,N',N'-tetraphenyl-biphenyl-4,4'-diamine segments. In embodiments, the SOF of the imagining member may be prepared from N,N,N',N'-tetrakis-[(4-hydroxymethyl)phenyl]-biphenyl-4,4'-diamine and N,N'-diphenyl-N,N'-bis-(3-hydroxyphenyl)-biphenyl-4,4'-diamine molecular building blocks.

In embodiments, a SOF may be incorporated into various components of an image forming apparatus. For example, a SOF may be incorporated into an electrophotographic photoreceptor, a contact charging device, an exposure device, a developing device, a transfer device and/or a cleaning unit. In embodiments, such an image forming apparatus may be equipped with an image fixing device, and a medium to which an image is to be transferred is conveyed to the image fixing device through the transfer device.

The contact charging device may have a roller-shaped contact charging member. The contact charging member may be arranged so that it comes into contact with a surface of the photoreceptor, and a voltage is applied, thereby being able to give a specified potential to the surface of the photoreceptor. In embodiments, a contact charging member may be formed from a SOF and/or capped SOF and or a metal such as aluminum, iron or copper, a conductive polymer material such as a polyacetylene, a polypyrrole or a polythiophene, or a dispersion of fine particles of carbon black, copper iodide, silver iodide, zinc sulfide, silicon carbide, a metal oxide or the like in an elastomer material such as polyurethane rubber, silicone rubber, epichlorohydrin rubber, ethylene-propylene rubber, acrylic rubber, fluororubber, styrene-butadiene rubber or butadiene rubber.

In embodiments the photoreceptor comprises an outer covering layer comprising an SOF in which the SOF has been manufactured to have SOF nano- to micron-scale surface-structures. Such and SOF may also be provided on a surface of the contact charging member of embodiments. In order to further adjust resistivity, such SOF nano- to micron-scale surface-structures may be a composite SOF or a capped SOF or a combination thereof, and in order to suppress deterioration, the SOF nano- to micron-scale surface-structures may be tailored to comprise an antioxidant either bonded or added thereto.

The resistance of the contact-charging member of embodiments may in any desired range, such as from about $10^0$ to about $10^{14}$ Ωcm, or from about $10^2$ to about $10^{12}$ Ωcm. When a voltage is applied to this contact-charging member, either a DC voltage or an AC voltage may be used as the applied voltage. Further, a superimposed voltage of a DC voltage and an AC voltage may also be used.

In an exemplary apparatus, the contact-charging member, optionally comprising an SOF, such as an SOF having nano- to micron-scale surface-structures, of the contact-charging device may be in the shape of a roller. However, such a contact-charging member may also be in the shape of a blade, a belt, a brush or the like.

In embodiments, an optical device that can perform desired imagewise exposure to a surface of the electrophotographic photoreceptor with a light source such as a semiconductor laser, an LED (light emitting diode) or a liquid crystal shutter, may be used as the exposure device.

In embodiments, a known developing device using a normal or reversal developing agent of a one-component system, a two-component system or the like may be used in embodiments as the developing device. There is no particular limitation on image forming material (such as a toner, ink or the like, liquid or solid) that may be used in embodiments of the disclosure.

Contact type transfer charging devices using a belt, a roller, a film, a rubber blade or the like, or a scorotron transfer charger or a scorotron transfer charger utilizing corona discharge may be employed as the transfer device, in various embodiments. In embodiments, the charging unit may be a biased charge roll, such as the biased charge rolls described in U.S. Pat. No. 7,177,572 entitled "A Biased Charge Roller with Embedded Electrodes with Post-Nip Breakdown to Enable Improved Charge Uniformity," the total disclosure of which is hereby incorporated by reference in its entirety.

Further, in embodiments, the cleaning device may be a device for removing a remaining image forming material, such as a toner or ink (liquid or solid), adhered to the surface of the electrophotographic photoreceptor after a transfer step, and the electrophotographic photoreceptor repeatedly subjected to the above-mentioned image formation process may be cleaned thereby. In embodiments, the cleaning device may be a cleaning blade, a cleaning brush, a cleaning roll or the like. Materials for the cleaning blade include SOFs or urethane rubber, neoprene rubber and silicone rubber In an exemplary image forming device, the respective steps of charging, exposure, development, transfer and cleaning are conducted in turn in the rotation step of the electrophotographic photoreceptor, thereby repeatedly performing image formation. The electrophotographic photoreceptor may be provided with specified layers comprising SOF and photosensitive layers that comprise the desired SOF (the outer layer of the photoreceptor having SOF nano- to micron-scale surface-structures), and thus photoreceptors having excellent discharge gas resistance, mechanical strength, scratch resistance, particle dispersibility, etc., may be provided. Accordingly, even in embodiments in which the photoreceptor is used together with the contact charging device or the cleaning blade, or further with spherical toner obtained by chemical polymerization, good image quality may be obtained without the occurrence of image defects such as fogging. That is, embodiments of the invention provide image-forming apparatuses that can stably provide good image quality for a long period of time is realized.

A number of examples of the process used to make microfeature SOFs are set forth herein and are illustrative of the different compositions, conditions, techniques that may be utilized. Identified within each example are the nominal actions associated with this activity. The sequence and number of actions along with operational parameters, such as temperature, time, coating method, and the like, are not limited by the following examples. All proportions are by weight unless otherwise indicated. The term "rt" refers, for example, to temperatures ranging from about 20° C. to about 25° C. Unless otherwise noted, the SOFs produced in the following examples were either pinhole-free SOFs or substantially pinhole-free SOFs.

Given the examples below it will be apparent, that the compositions prepared by the methods of the present disclosure may be practiced with many types of components and may have many different uses in accordance with the disclosure above and as pointed out hereinafter.

EXAMPLES

A wet formulation of a structured organic film was prepared with the components identified in Table 2 in N-methylpyrrolidone (NMP) at 25% solid loading. The viscosity of the resulting formulation was 14 cPs.

Figure 5A:
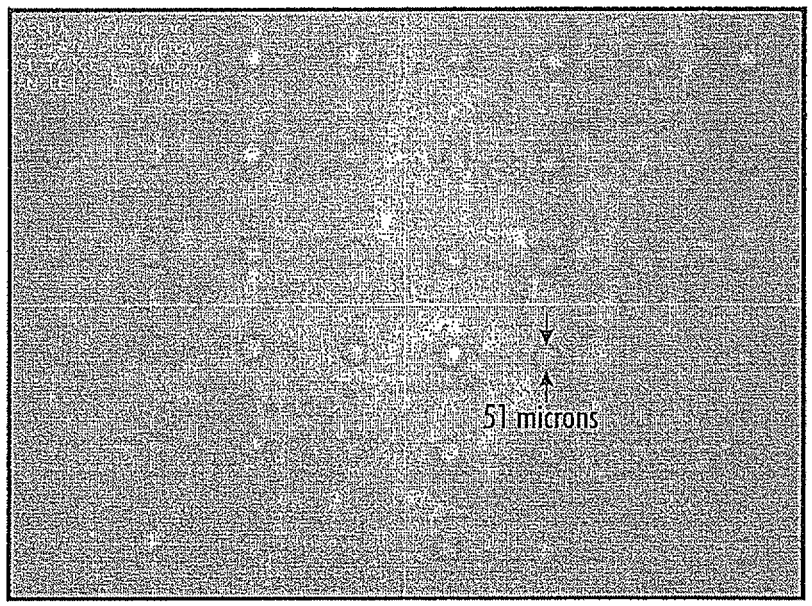
FIGS. 5A and B are electron microscope images of the patterned SOF microfeatures before and after curing.
Figure 5B:
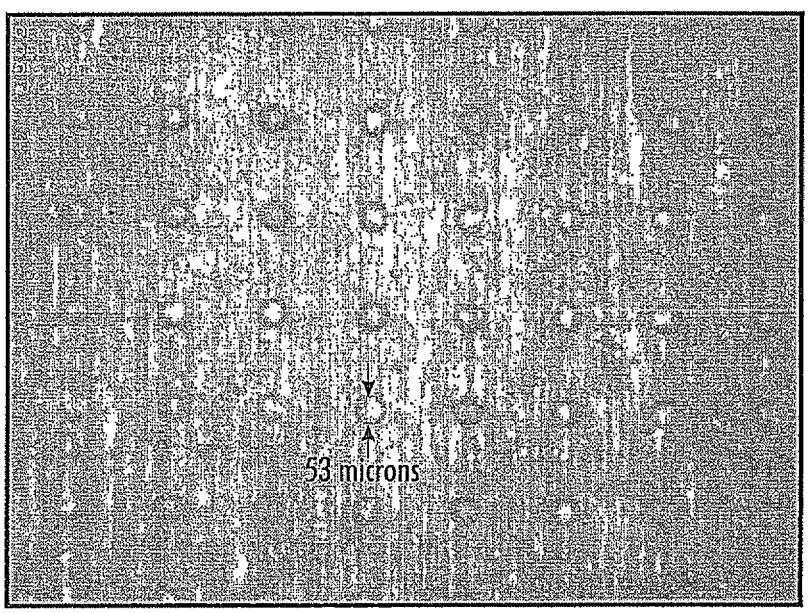

The formulation was loaded into a Dimatix inkjet printer. The inkjet printer was used to deposit the SOF wet formulation in a test arrangement on Mylar® and commercial Xerox belt photoreceptor substrates without (Examples 1 and 2) and with (Examples 3 and 4) an overcoat layer. For the photoreceptor substrates containing an overcoat layer, the overcoat was an SOF as described in U.S. patent application Ser. No. 13/246,268, which is incorporated herein by reference in its entirety. The resulting SOF wet layer was cured at 140° C. for 30 minutes to form dry SOF microfeatures. The size and shape of the resulting SOF microfeatures were determined and are reported in Table 3. An optical microscope image and optical profilometry of the microfeatures before and after curing is provided in FIGS. 5A and 5B.

TABLE 3

Characteristics of SOF microfeatures.

| Sample Characteristics | Pre-cure | Post-cure |
| --- | --- | --- |
| Avg. spot diameter (μm) | 53.9 ± 5.2 | 55.0 ± 4.9 |
| Peak spot diameter (μm) | 150 ± 11 | 148 ± 8 |
| Avg. spot height (Å) | 4400 ± 700 | 3400 ± 590 |
| Peak spot height (Å) | 6000 ± 1000 | 4300 ± 750 |
| Avg. line width (μm) | 51.9 ± 6.4 | 53.1 ± 8.5 |
| Avg. line height (Å) | 6600 ± 525 | 4400 ± 780 |
| Peak line height (Å) | 9600 ± 770 | 9600 ± 940 |

Testing Results: Electrical Evaluation (PIDC)

The inkjet-printed samples were tested electrically (PIDC) to test if there was any negative impact from the printing/curing process. Application of the surface pattern directly on the charge transport layer (Example 1) and on an overcoated (Example 2) sample had little impact on the electrical performance. The results of the testing are reported in Table 4.

TABLE 4

Electrical evaluation.

| Sample | Dark Decay | S (V · ergs/cm$^2$) | $E_{1/2}$ | $E_{7/8}$ | Vr |
| --- | --- | --- | --- | --- | --- |
| Example 1 | 24 | 447 | 1.00 | 2.34 | 7 |
| Example 2 | 23 | 444 | 0.99 | 2.27 | 6 |
| Example 3 | 79 | N/A | 1.67 | N/A | 52 |
| Example 4 | 88 | N/A | 1.67 | 7.63 | 52 |

The xerographic electrical properties were determined by electrostatically charging their surfaces with a corona dis-

TABLE 2

Exemplary SOF wet formulation.

| | Type | | | | | |
| --- | --- | --- | --- | --- | --- | --- |
| | Binder | CTM | Curing Compound | Catalyst | Leveling | Solvent |
| | N4,N4,N4',N4'-tetrakis(4-(methoxymethyl)phenyl)biphenyl-4,4'-diamine | N4,N4'-diphenyl-N4,N4'-bis(3-(hydroxyl)phenyl)biphenyl-4,4'-diamine | Cymel 303 | Naeure XP-357 | Silclean 3700 | NMP |
| Percent Mass (%) | 10.00 | 13.25 | 1.25 | 1.25 | 1.00 | 73.25 |
| Percent Active (%) | 100 | 100 | 100 | 20 | 25 | 100 |
| Scaled Mass (g) | 0.40 | 0.53 | 0.05 | 0.05 | 0.04 | 2.93 | charging device, in the dark, until the surface potential attained an initial value $V_{ddp}$ of about 700 volts, as measured 100 ms later by a capacitively coupled probe attached to an electrometer. The charged members were then exposed to light (785 nm, 200 ms after charging) from a filtered xenon lamp. A reduction in the surface potential to $V_{bg}$ background potential due to photodischarge effect, was observed at 500 ms following exposure. Photodischarge characteristics are represented by $E_{1/2}$ and $E_{7/8}$ values. $E_{1/2}$ is the exposure energy required to achieve a photodischarge from Vddp to ½ of Vddp and $E_{7/8}$ the energy for a discharge from Vddp to ⅛ of Vddp. The light energy used to photodischarge the imaging member during the exposure step was measured with a light meter. The higher the photosensitivity, the smaller are $E_{1/2}$ and $E_{7/8}$ values. Residual potential after erase Vr was measured after the device was further subjected to a high intensity white light irradiation from a secondary filtered xenon lamp.

It will be appreciated that several of the above-disclosed and other features and functions, or alternatives thereof, may be desirably combined into many other different systems or applications. Various presently unforeseen or unanticipated alternatives, modifications, variations or improvements therein may be subsequently made by those skilled in the art which are also intended to be encompassed by the following claims. Unless specifically recited in a claim, steps or components of claims should not be implied or imported from the specification or any other claims as to any particular order, number, position, size, shape, angle, color, or material.

What is claimed is:

1. A method for forming a structured organic film (SOF) micro-feature, the method comprising:
    providing a substrate;
    discharging at least one droplet toward the substrate by an inkjet method and depositing the at least one droplet on a surface of the substrate, the at least one droplet comprising a reaction mixture comprising a plurality of molecular building blocks; and
    promoting a change in one or more of the at least one deposited droplets to form a plurality of SOF micro-features, each SOF micro-feature in the plurality of SOF micro-features comprising a plurality of segments including at least a first segment type and a plurality of linkers including at least a first linker type arranged as a covalent organic framework (COF) on the surface of the substrate; wherein
    the SOP micro-features of the plurality of SOF micro-features are arranged in a pattern on the surface of the substrate, the pattern including an array of protrusions or bumps in which the protrusions or bumps are uniformly positioned across the surface of the substrate.

2. The method of claim 1, wherein the viscosity of the reaction mixture is from about 2 cPs to about 30 cPs.

3. The method of claim 1, wherein the inkjet method is selected from the group consisting of thermal inkjet methods, piezoelectric inkjet methods, and continuous inkjet methods.

4. The method of claim 1, wherein the at least one droplet is charged.

5. The method of claim 1, wherein the SOF micro-feature is a dry SOF and is covalently bonded to the substrate.

6. The method of claim 1, wherein the substrate is a photoreceptor comprising an SOF as the outer layer.

7. The method of claim 6, wherein the SOF micro-features are covalently bonded to the SOF of the photoreceptor.

8. The method of claim 7, wherein the pattern results in a roughness on the surface of the photoreceptor.

9. The method of claim 7, wherein the pattern results in a roughness throughout the surface of the outer layer of the photoreceptor that lowers friction of the surface of the photoreceptor with a cleaning blade.

10. The method of claim 1, wherein the substrate further comprises an SOF micro-feature having a shape selected from the group consisting of lines, conic sections, regular polygons ridges, circles, rods, squares, triangles, polygons, and mixtures thereof formed at a predetermined position on the surface of the substrate.

11. A method for forming a structured organic film (SOF) micro-feature, the method comprising:
    providing a substrate;
    discharging a first one or more droplets toward the substrate by an ink jet method and depositing at least one of the first one or more droplets on a surface of the substrate at a first predetermined location, the first one or more droplets including a first reaction mixture comprising a first plurality of molecular building blocks;
    promoting a change in one or More of the at least one deposited droplets to form a plurality of SOF micro-features, each SOP micro-feature in the plurality of SOF micro-features comprising a plurality of segments including at least a first segment type and a plurality of linkers including at least a first linker type arranged as a covalent organic framework (COF) on the surface of the substrate; wherein
    the plurality of SOF micro-features are arranged in a pattern on the surface of the substrate, the pattern including an array of protrusions or bumps in which the protrusions or bumps are positioned at predetermined distance away from the adjacent protrusions or bumps on the surface of the substrate, and
    the substrate is a photoreceptor comprising an SOP as the outer layer.

12. The method of claim 11, wherein the viscosity of the first reaction mixture is from about 2 cPs to about 30 cPs.

13. The method of claim 11, wherein the inkjet method is selected from the group consisting of thermal inkjet methods, piezoelectric inkjet methods, and continuous inkjet methods.

14. The method of claim 11, further comprising discharging a second one or more droplets toward the substrate by an ink jet method and depositing at least one of the second one or more droplets on a surface of the substrate at a second predetermined location, the second one or more droplets including a second reaction mixture comprising a second plurality of molecular building blocks.

15. The method of claim 14, wherein the viscosity of the second reaction mixture is from about 2 cPs to about 30 cPs.

16. The method of claim 14, wherein the first reaction mixture is not miscible with the second reaction mixture.

17. The method of claim 14, wherein the second plurality of molecular building blocks have a different chemical structure than the first plurality of molecular building blocks.

18. The method of claim 14, wherein the viscosity of the second reaction mixture is greater than the viscosity of the first reaction mixture, and the chemical structure of the second plurality of molecular building blocks is the same as the first plurality of molecular building blocks.

19. The method of claim 14, wherein the viscosity of the second reaction mixture is less than the viscosity of the first reaction mixture, and the chemical structure of the second plurality of molecular building blocks is the same as the first plurality of molecular building blocks.

20. The method of claim 11, wherein the substrate further comprises an SOF micro-feature having a shape selected from the group consisting of lines, conic sections, regular polygons, ridges, circles, rods, squares, triangles, polygons, and mixtures thereof formed at a predetermined position on the surface of the substrate.

* * * * *